(12) United States Patent
Namihira et al.

(10) Patent No.: US 11,177,399 B2
(45) Date of Patent: Nov. 16, 2021

(54) NANOPARTICLE ASSEMBLIES AND METHOD FOR PRODUCING NANOPARTICLE ASSEMBLIES

(71) Applicants: National University Corporation Kumamoto University, Kumamoto (JP); NIKON CORPORATION, Tokyo (JP)

(72) Inventors: Takao Namihira, Kumamoto (JP); Yasutaka Nishi, Tokyo (JP); Makoto Nakazumi, Yamato (JP); Koichiro Iwahori, Fuchu (JP)

(73) Assignees: NATIONAL UNIVERSITY CORPORATION KUMAMOTO UNIVERSITY, Kumamoto (JP); NIKON CORPORATION, Tokyo (JP)

( * ) Notice: Subject to any disclaimer, the term of this patent is extended or adjusted under 35 U.S.C. 154(b) by 167 days.

(21) Appl. No.: 16/263,921

(22) Filed: Jan. 31, 2019

(65) Prior Publication Data

US 2019/0165190 A1    May 30, 2019

Related U.S. Application Data

(63) Continuation of application No. PCT/JP2017/026295, filed on Jul. 20, 2017.

(30) Foreign Application Priority Data

Aug. 10, 2016 (JP) .............................. JP2016-157933

(51) Int. Cl.
*H01L 31/0224* (2006.01)
*H01L 31/0236* (2006.01)
(Continued)

(52) U.S. Cl.
CPC ........ *H01L 31/022475* (2013.01); *B22F 1/00* (2013.01); *B82Y 30/00* (2013.01);
(Continued)

(58) Field of Classification Search
CPC ....... H01L 31/022475; H01L 31/02168; H01L 31/0236; B82Y 30/00; B82Y 40/00; B05D 1/06
See application file for complete search history.

(56) References Cited

U.S. PATENT DOCUMENTS

| | | | |
|---|---|---|---|
| 6,755,886 B2 * | 6/2004 | Phillips | ................. B22F 1/0096 75/346 |
| 2003/0082237 A1 | 5/2003 | Cha et al. | |
| 2008/0118734 A1 * | 5/2008 | Goodwin | ............... A01N 25/10 428/221 |

FOREIGN PATENT DOCUMENTS

| | | |
|---|---|---|
| JP | 2005-302509 | 10/2005 |
| JP | 2007-179766 | 7/2007 |

(Continued)

OTHER PUBLICATIONS

International Search Report dated Sep. 19, 2017 in corresponding International Application No. PCT/JP2017/026295.
(Continued)

*Primary Examiner* — Michael P Wieczorek
(74) *Attorney, Agent, or Firm* — Staas & Halsey LLP

(57) ABSTRACT

The nanoparticle assembly includes nanoparticles having an average primary particle size of 60 nm or less, and the nanoparticle assembly has a diameter of more than 500 nm and 5 μm or less.

14 Claims, 29 Drawing Sheets

(51) Int. Cl.
| | |
|---|---|
| *H01L 31/0216* | (2014.01) |
| *H01L 51/44* | (2006.01) |
| *H01L 51/52* | (2006.01) |
| *H01L 33/00* | (2010.01) |
| *B82Y 40/00* | (2011.01) |
| *B22F 1/00* | (2006.01) |
| *C23C 14/00* | (2006.01) |
| *C01G 19/00* | (2006.01) |
| *C01G 15/00* | (2006.01) |
| *B82Y 30/00* | (2011.01) |

(52) U.S. Cl.
CPC .............. *B82Y 40/00* (2013.01); *C01G 15/00* (2013.01); *C01G 19/00* (2013.01); *C23C 14/00* (2013.01); *H01L 31/0236* (2013.01); *H01L 31/02168* (2013.01); *H01L 33/00* (2013.01); *H01L 51/442* (2013.01); *H01L 51/5206* (2013.01); *C01P 2002/54* (2013.01); *C01P 2004/64* (2013.01); *H01L 2251/308* (2013.01)

(56) References Cited

FOREIGN PATENT DOCUMENTS

| | | |
|---|---|---|
| JP | 2008-222467 | 9/2008 |
| JP | 2009-536266 | 10/2009 |
| JP | 2011-213505 | 10/2011 |
| JP | 2013-196936 | 9/2013 |
| JP | 2014-156622 A | 8/2014 |
| JP | 2015-105328 | 6/2015 |

OTHER PUBLICATIONS

Saric, A., et al., "Solvothermal Synthesis of Zinc Oxide Microspheres", Journal of Alloys and Compounds, vol. 652, Aug. 2015, pp. 91-99.
Mazloumi, M., et al. "Self-Assembly of ZnO Nanoparticles and Subsequent Formation of Hollow Microspheres", Journal of Alloys and Compounds, vol. 468, Jan. 2009, pp. 303-307.
Korean Office Action dated Jul. 30, 2020, in corresponding Korean Patent Application No. 10-2020-7018638.
Makoto Nakazumi et al., "The Development of ITO Nanoparticles TCF using Mist Deposition Method", The 63th JSAP Spring Meeting, Mar. 2016.

* cited by examiner

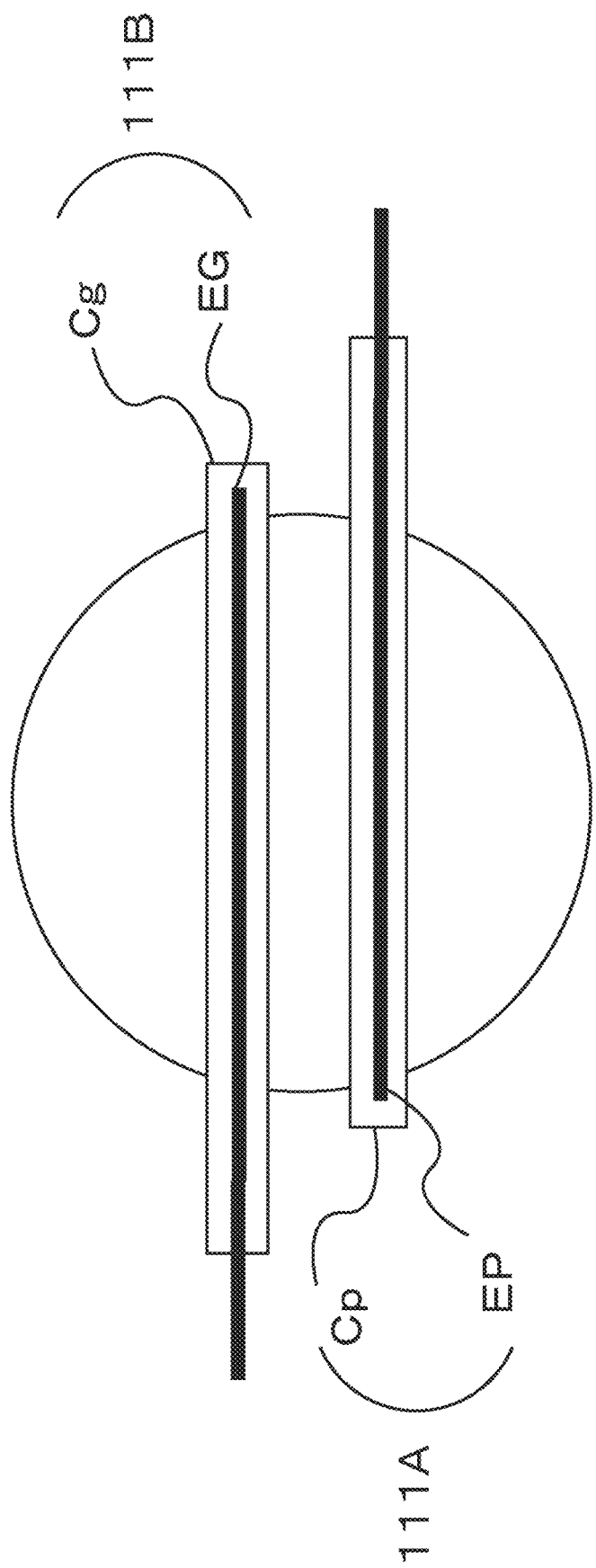

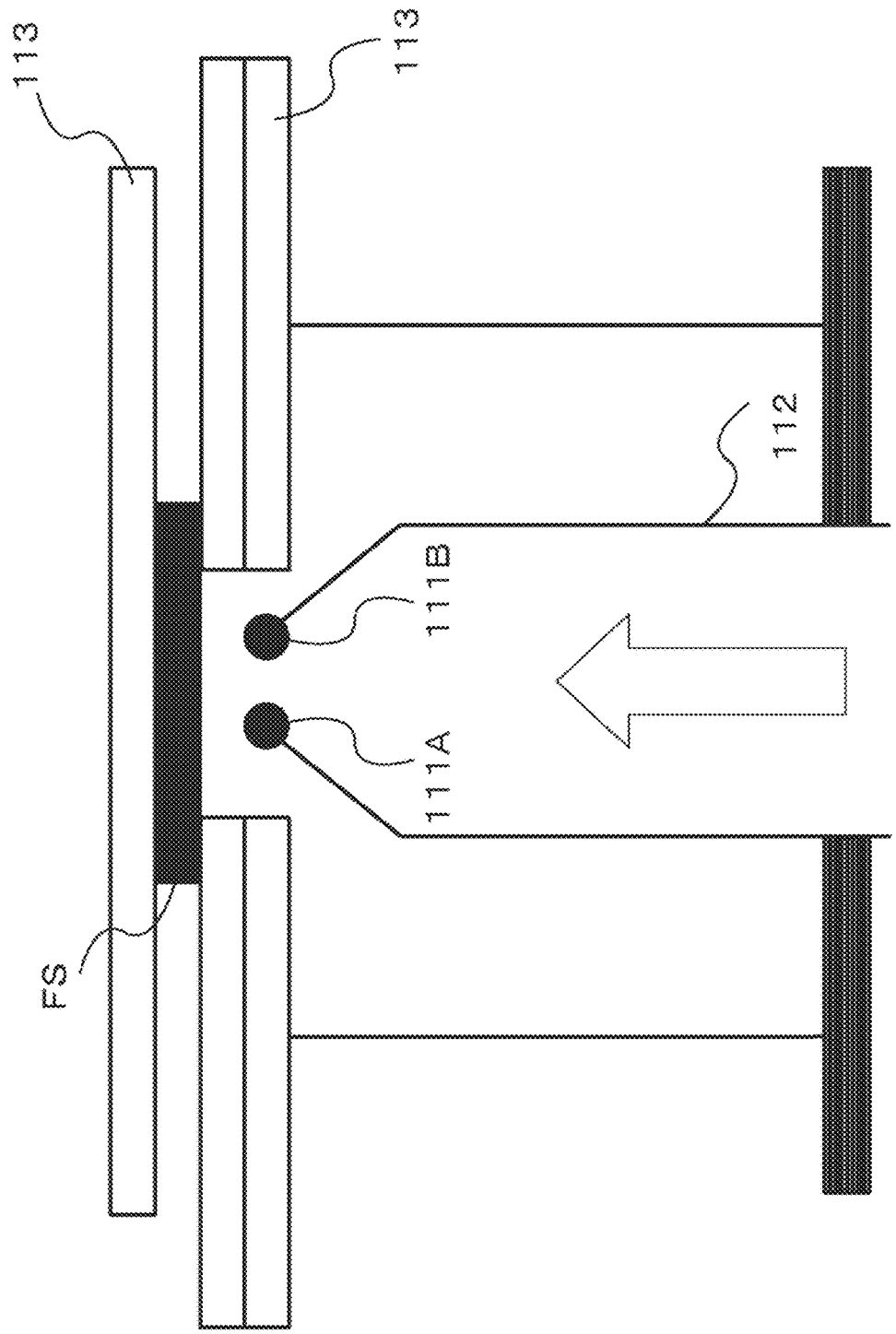

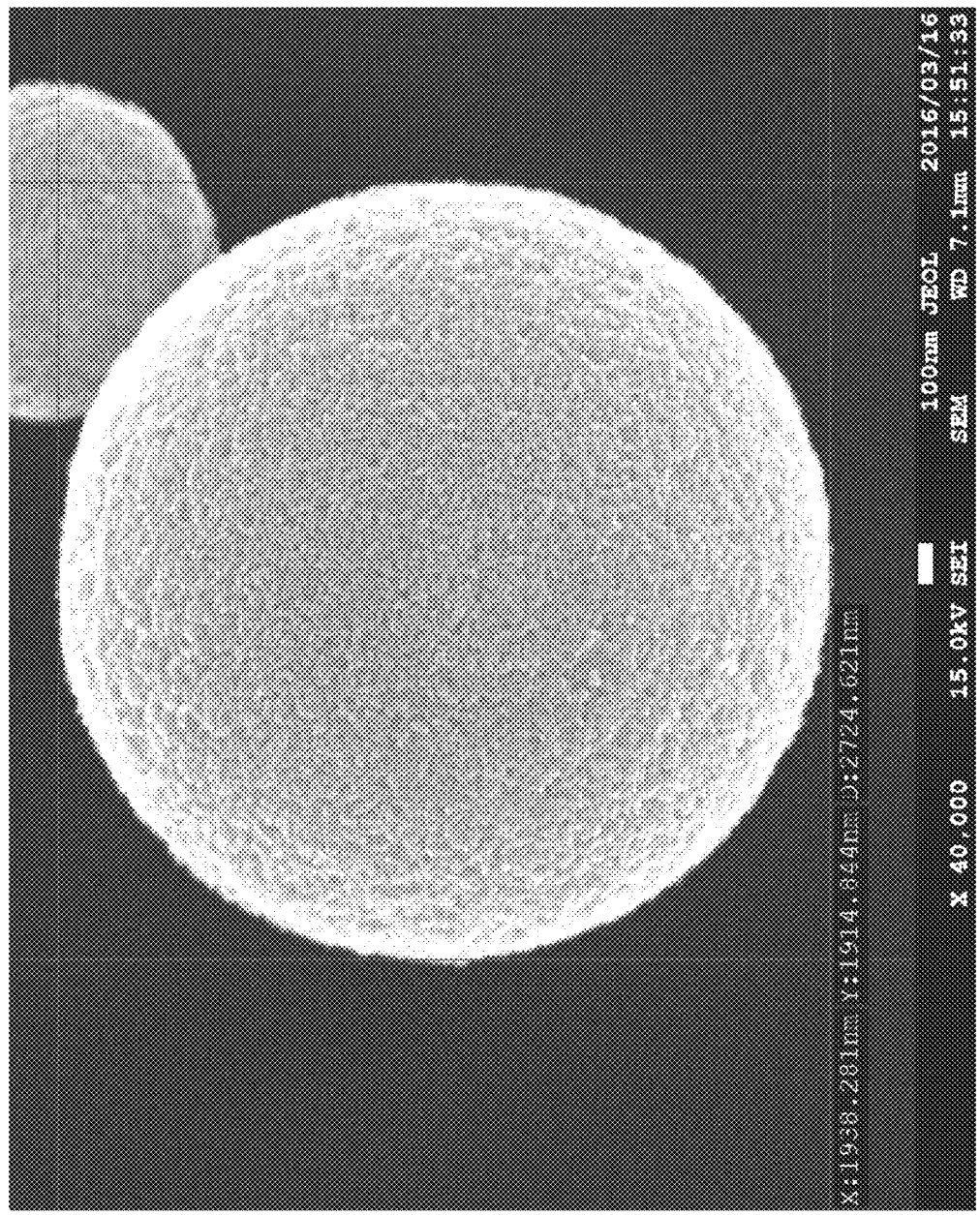

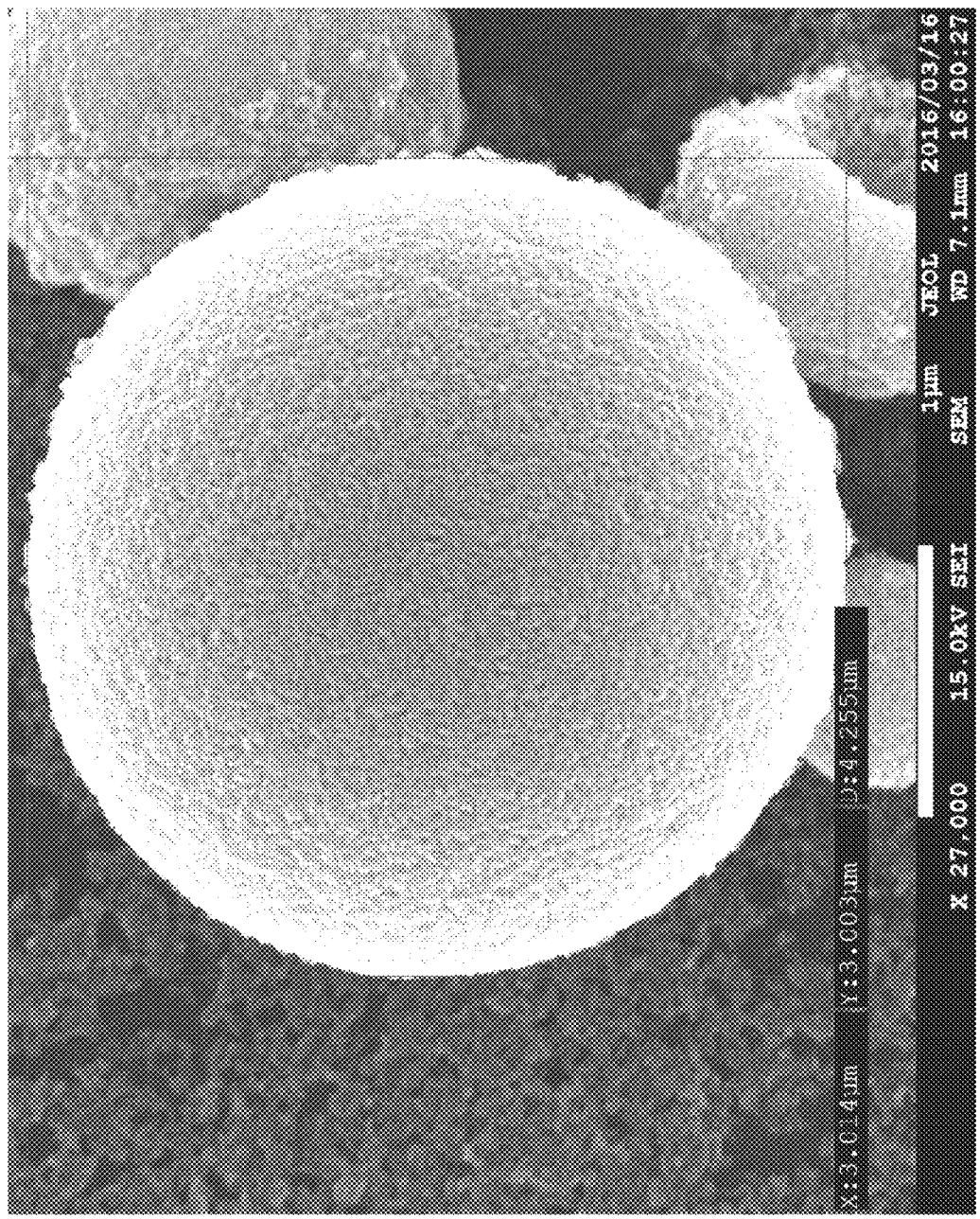

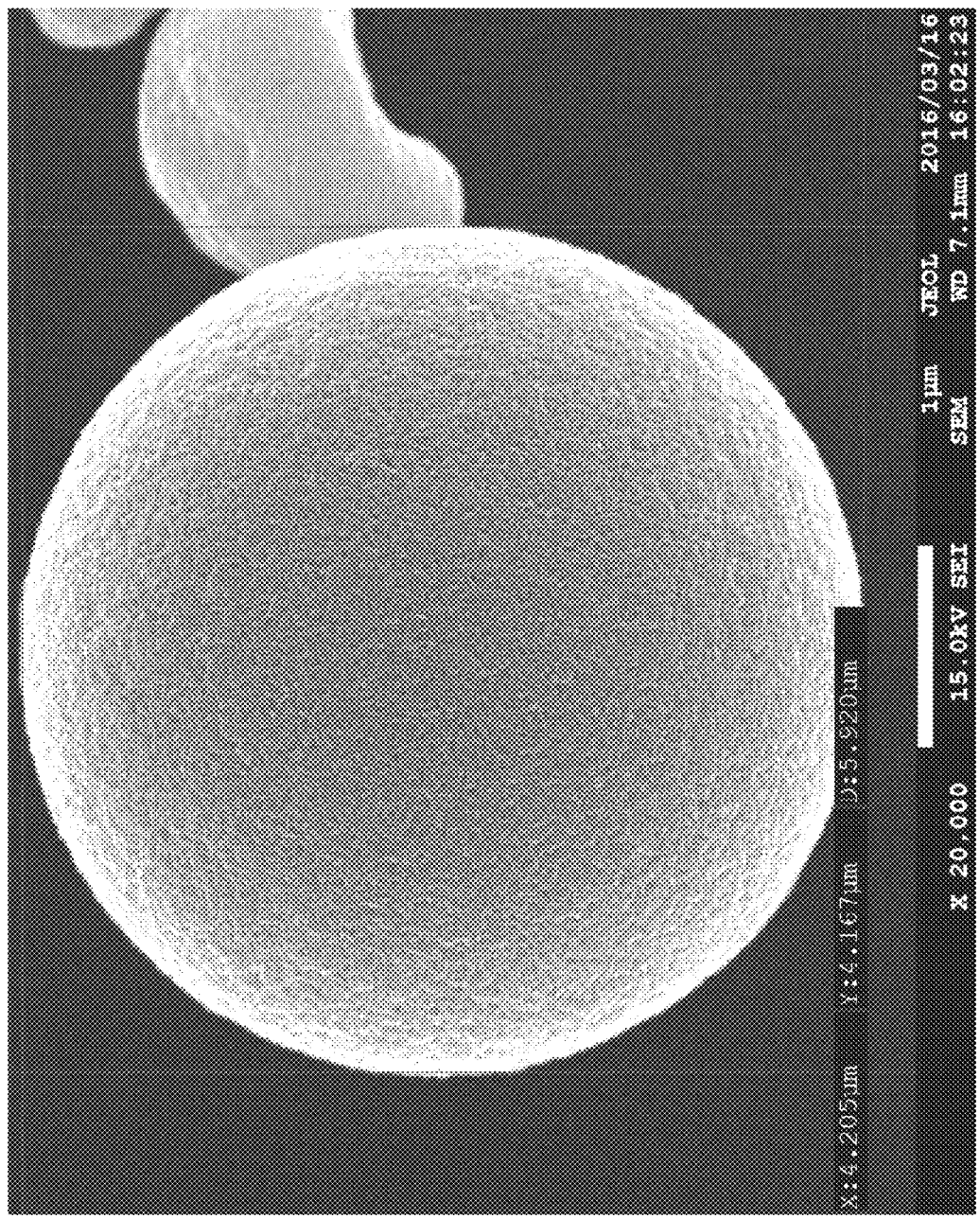

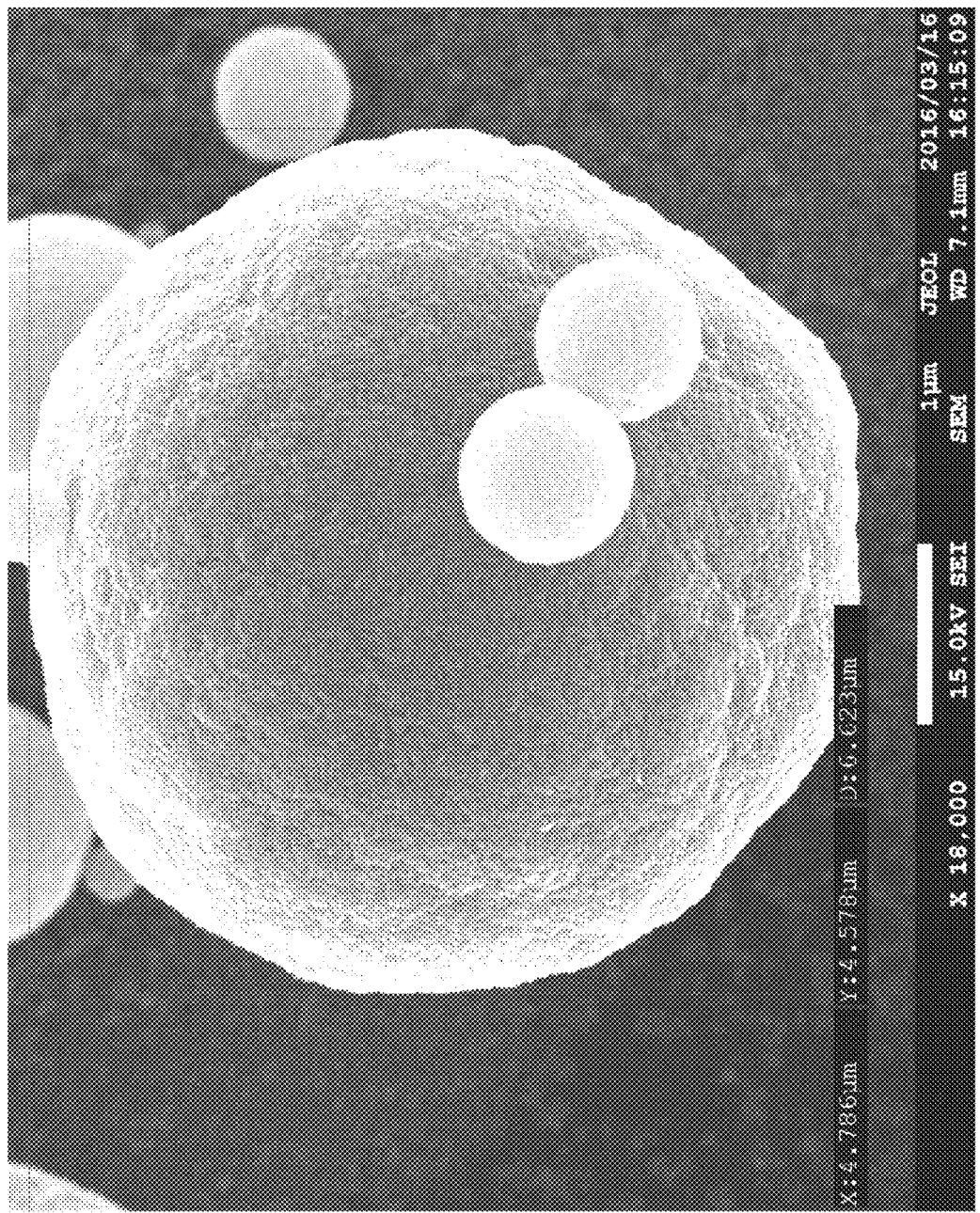

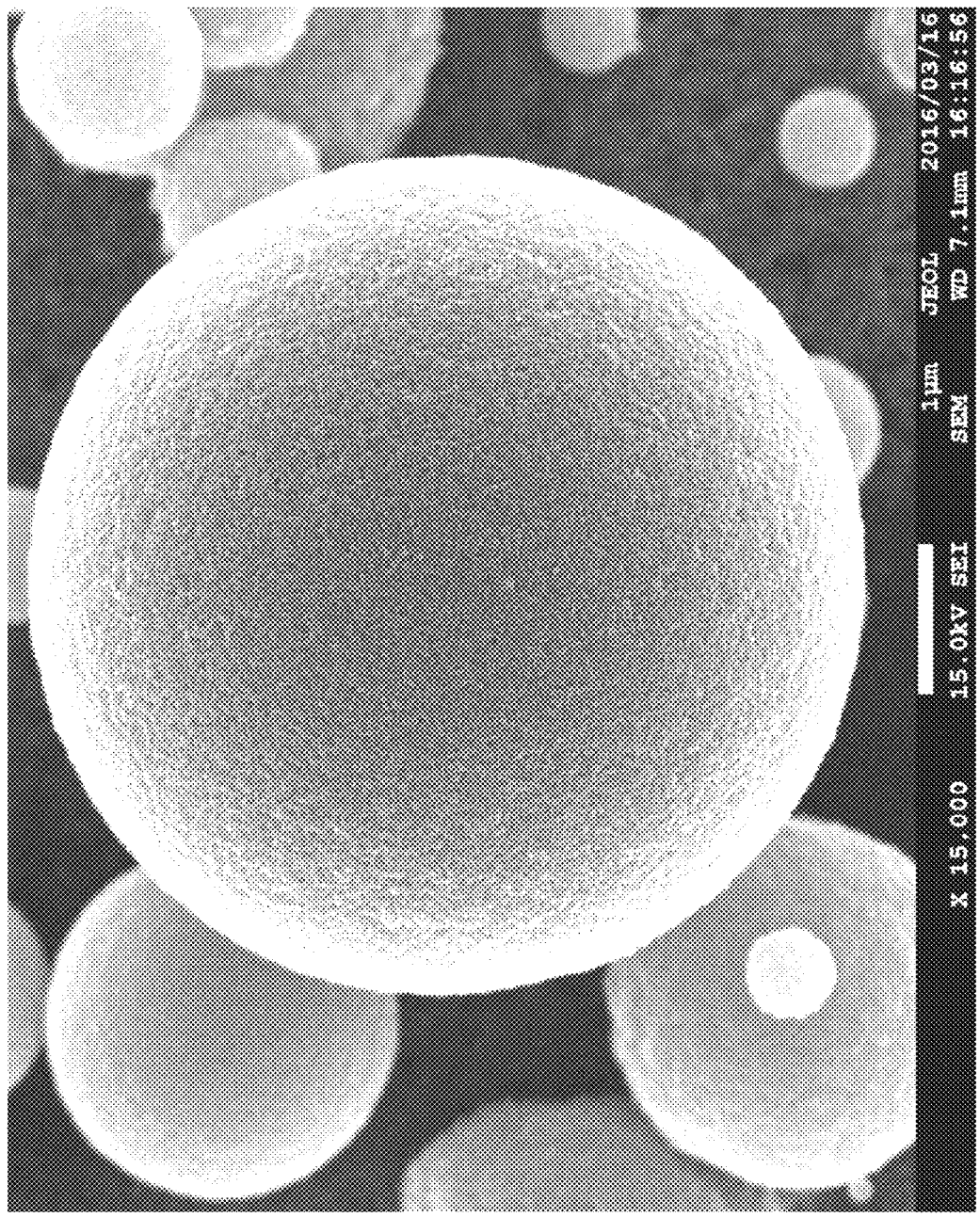

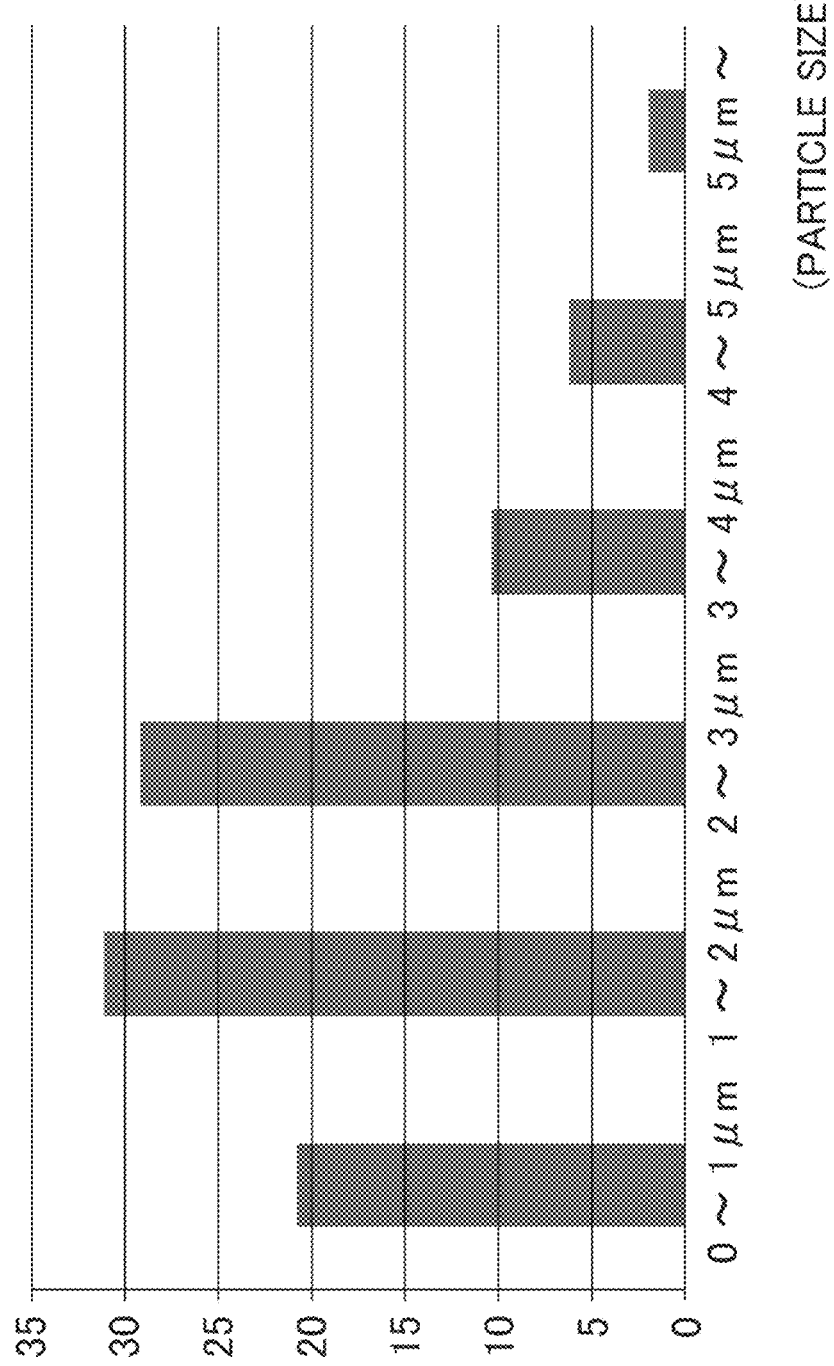

NANOPARTICLE ASSEMBLIES AND METHOD FOR PRODUCING NANOPARTICLE ASSEMBLIES

CROSS-REFERENCE TO RELATED APPLICATIONS

The present invention relates to nanoparticle assemblies and a method for producing nanoparticle assemblies. The present invention is a continuation of International Application No. PCT/JP2017/26295 filed Jul. 20, 2017 and claims the priority of JP 2016-157933 A filed on Aug. 10, 2016, the contents of which are hereby incorporated by reference.

BACKGROUND

Related Art

As an example of nanoparticle assemblies used for solar cells or the like, JP 2011-213505 A discloses "a titanium oxide nanoparticle assembly which includes titanium oxide nanoparticles (A) having an average primary particle size of 20 nm or less, and which has an average diameter of 30 to 500 nm." Nanoparticles are used not only for solar cells but also for photocatalysts, filtration filters, and the like. However, a nanoparticle production method in the related art limits the size of nanoparticle assemblies to be produced.

SUMMARY

A first aspect of the present invention is a nanoparticle assembly which includes a nanoparticle having an average primary particle size of 60 nm or less, and which has a diameter of more than 500 nm and 5 µm or less.

A second aspect of the present invention is a method for producing a nanoparticle assembly according to the first aspect, the method involving: mist generation in which a solution containing a nanoparticle is prepared and mist of the solution is generated; plasma generation in which a plasma is generated between a first electrode and a second electrode; and nanoparticle assembly production in which the mist is supplied between the first electrode and the second electrode and in which a nanoparticle assembly is generated. In the plasma generation, the plasma has a ratio of emission intensities ($I_{391}/I_{357}$) of 0.072 or more and less than 0.08, where $I_{391}$ is an emission intensity at a wavelength of 391 nm and $I_{357}$ is an emission intensity at a wavelength of 357 nm.

BRIEF DESCRIPTION OF DRAWINGS

FIGS. 2A and 2B are (first) views for explaining details of the nanoparticle assembly producing apparatus according to the embodiment;

FIG. 3 is a (second) view for explaining details of the nanoparticle assembly producing apparatus according to the embodiment;

FIGS. 16A to 16F are FE-SEM images of a nanoparticle assembly according to Example 4 (19 kV-10 kHz);

FIG. 22 is a particle size distribution according to Example 6 (19 kV-6 kHz).

DETAILED DESCRIPTION

Hereinafter, an exemplary embodiment of the present invention will be described.

Figure 1:
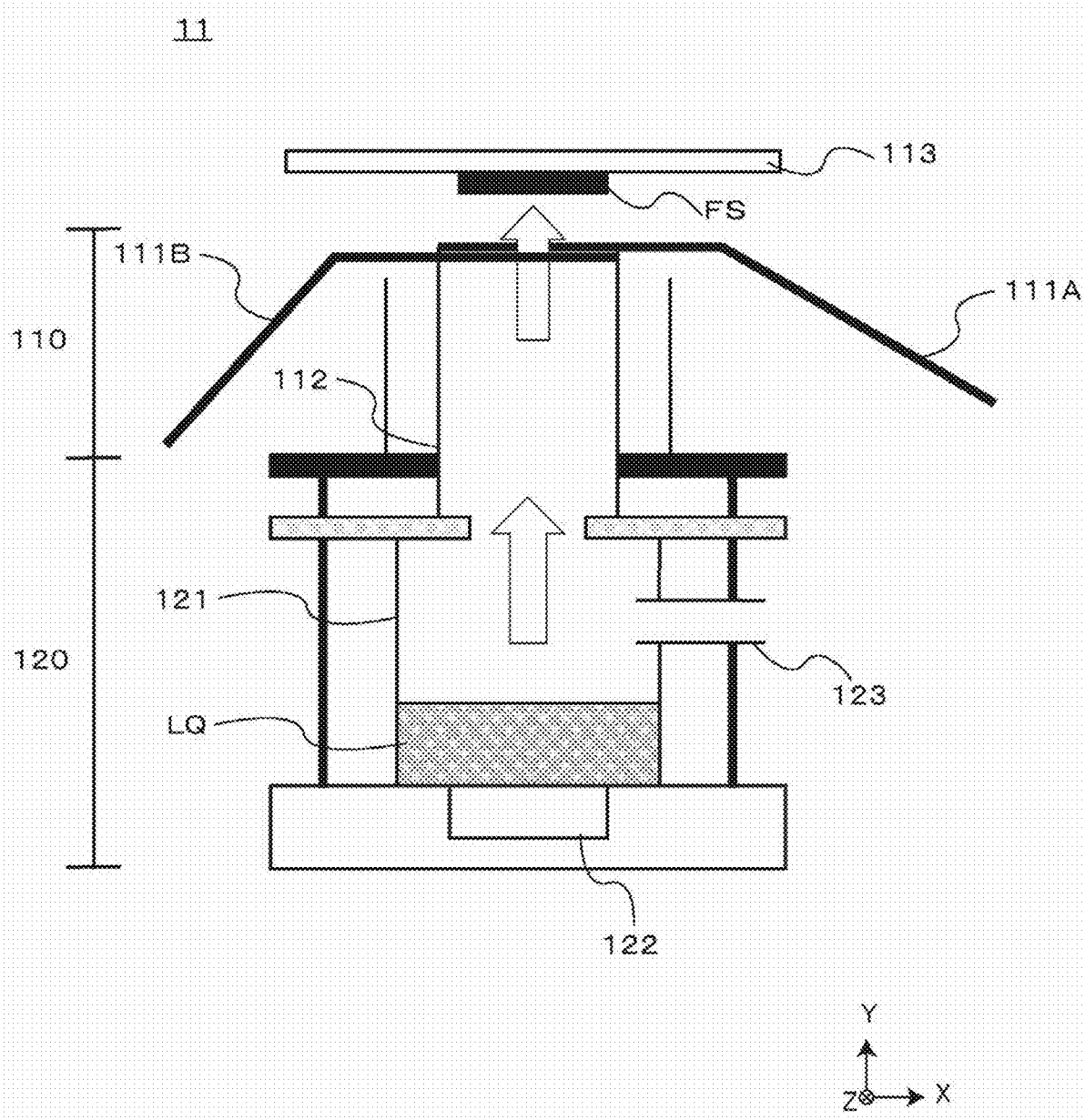
FIG. 1 is a view showing an example of a nanoparticle assembly producing apparatus according to an embodiment.

In this embodiment, described is a method for producing a nanoparticle assembly with a nanoparticle assembly producing apparatus 11 shown in FIG. 1.

A nanoparticle assembly produced in this embodiment is an assembly including assembled nanoparticles. In other words, the nanoparticle assembly is a secondary particle which is formed of nanoparticles which are primary particles are assembled. In this embodiment, examples of the assembly include an aggregate and a polycrystal.

The nanoparticle assembly includes nanoparticles which are the primary particles having an average particle size of 60 nm or less, and the nanoparticle assembly has a diameter of more than 500 nm and 5 µm or less. The average particle size herein represents a mean number diameter of particles obtained by a dynamic light-scattering particle size analyzer. The diameter of the nanoparticle assembly herein represents a value obtained from a mean value of the long axis and the short axis of the nanoparticle assembly in an image of the nanoparticle assembly observed by SEM.

It is desirable that the nanoparticle assembly has a diameter of more than 800 nm and 5 µm or less. More desirably, the nanoparticle assembly has a diameter of more than 1 µm and 5 µm or less. The nanoparticle assembly is preferably used for, for example, a photocatalyst, a solar cell, and a diffuser plate.

In order to obtain a preferable nanoparticle assembly, it is desirable that the nanoparticles have an average primary particle size of more than 10 nm and 50 nm or less. More desirably, the nanoparticles have an average primary particle size of more than 20 nm and 40 nm or less.

Examples of the nanoparticles include mixed oxides, mixed fluorides, and mixed nitrides of one or more kinds of indium, zinc, tin, titanium, tantalum, and gallium, specifically, MgO, $Al_2O_3$, $SiO_2$, $TiO_2$, $VO_2$, $Mn_2O_3$, $Fe_2O_3$, NiO, CuO, ZnO, $Ga_2O_3$, $Nb_2O_5$, AgO, $SnO_2$, $Sb_2O_3$, $MgF_2$, AlN, $Si_3N_4$, TiN, FeN, BN, InN, and SbN. Alternatively, instead of oxides, the nanoparticles may be mixed metals of one or more kinds of indium, zinc, tin, titanium, tantalum, and gallium. The nanoparticles may also be organic compounds containing polystyrene and the like.

FIG. 1 is a view showing an example of the nanoparticle assembly producing apparatus 11 used in a method for producing a nanoparticle assembly according to this embodiment. The nanoparticle assembly producing apparatus 11 includes a plasma generation unit 110 and a mist generation unit 120.

The plasma generation unit 110 includes an electrode 111A, an electrode 111B, a mist route 112, and a substrate holder 113. The electrode 111A is a high-voltage electrode, and the electrode 111B is a ground electrode. The electrode 111A and the electrode 111B are electrodes each including a metallic conductive wire covered with a dielectric, as described later in detail. Application of a voltage generates a plasma between the electrode 111A and the electrode 111B. The mist route 112 guides mist generated in the mist generation unit 120 between the electrodes. Being influenced by the plasma generated between the electrodes, the mist leads to formation of an assembly.

The substrate holder 113 places a substrate FS above the plasma generation unit 110. A commonly used material is employable as the substrate FS. Examples of the material include glass, polyethylene terephthalate (PET), polyethylene naphthalate (PEN), polyethersulfone (PES), polyetherimide, polyether ether ketone, polyphenylenesulfide, polyarylate, polyimide, polycarbonate (PC), cellulose triacetate (TAC), and cellulose acetate propionate (CAP).

The mist generation unit 120 includes a mist generation tank 121, an ultrasonic transducer 122, and a gas inlet pipe 123. The mist generation tank 121 accumulates a precursor LQ. The precursor LQ is produced by dispersing the nanoparticles which are the primary particles in a dispersion medium. In this embodiment, metal oxide particulates are used as particulates. The dispersion medium is not limited as long as particulates are dispersible therein, and may be water, alcohol such as isopropyl alcohol (IPA) and ethanol, and a mixture thereof.

The ultrasonic transducer 122 generates ultrasonic waves and mists the precursor LQ inside the tank. The gas inlet pipe 123 supplies gas to the mist generation tank 121. The gas introduced into the gas inlet pipe 123 is, for example, Ar, but is not limited thereto.

A process flow according to this embodiment will now be described. First, in the mist generation tank 121, the ultrasonic transducer 122 mists the accumulated precursor LQ. Next, mist including the nanoparticles is supplied to the mist route 112 by the gas supplied from the gas inlet pipe 123. Next, the mist supplied to the mist route 112 passes between the electrode 111A and the electrode 111B.

At this time, the nanoparticles included in the mist are excited by the plasma generated by application of a voltage to the electrode 111A and the electrode 111B, whereby forming an assembly. The nanoparticle assembly formed herein adheres to a surface of the substrate FS. Note that the assembly formed herein has a substantially spherical shape. When producing an object such as a filter with the nanoparticle assembly, since the nanoparticle assembly has a substantially spherical shape, it is possible to produce an appropriate object.

Figure 2A:
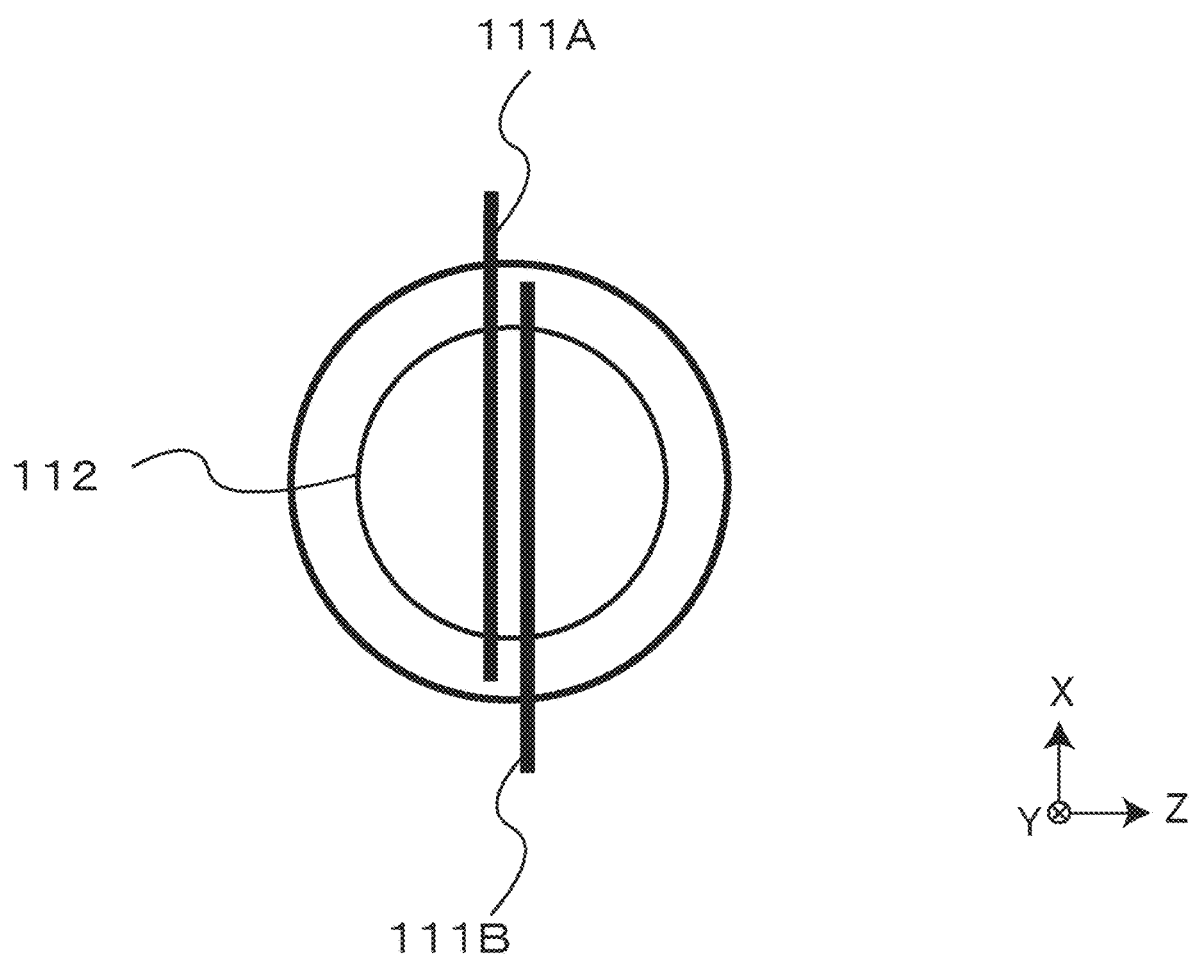

FIGS. 2A and 2B are (first) views for explaining details of the nanoparticle assembly producing apparatus 11. FIG. 2A shows the nanoparticle assembly producing apparatus 11 viewed from the top, that is, the nanoparticle assembly producing apparatus 11 in FIG. 1 viewed from the +Y direction. The nanoparticle assembly producing apparatus 11 shown in FIG. 1 is a cross-section of the nanoparticle assembly producing apparatus 11 shown in FIG. 2A being sliced along a plane parallel to the X-axial direction and viewed from the +Z direction. FIG. 2A show an outer diameter of the mist route 112.

In this embodiment, the mist that has passed through the mist route 112 having a substantially ring shape passes between the electrode 111A and the electrode 111B, causing the nanoparticles to form an assembly.

FIG. 2B shows the nanoparticle assembly producing apparatus 11 shown in FIG. 2A being rotated by 90 degrees clockwise and viewed from the bottom (−Y direction shown in FIG. 1).

The electrode 111A includes a wire electrode EP and a dielectric Cp. The electrode 111B includes an electrode EG and a dielectric Cg. The electrode EP and the electrode EG are not limited in materials as long as they are a conductor. Examples of the materials include tungsten and titanium.

The electrode EP and the electrode EG are not limited to wires and may be flat plates. However, in a case where flat plates are used as electrodes, it is desirable that surfaces including opposing edges are parallel to each other. Each electrode may be formed of a flat plate having a sharp edge like a knife. However, in that case, an electric field is concentrated at the edge, which may cause arcing. It is desirable that each electrode has a wire shape rather than a flat plate shape because a small surface area of the electrode improves efficiency in plasma generation.

The electrode EP and the electrode EG are hereinafter described as being straight, but may be bent.

A dielectric is used as the dielectric Cp and the dielectric Cg. Examples of the dielectric Cp and the dielectric Cg include quartz and ceramics (insulating material such as silicon nitride, zirconia, alumina, silicon carbide, aluminum nitride, and magnesium oxide).

In this embodiment, a plasma is generated by dielectric barrier discharge. Therefore, it is necessary to provide a dielectric between the electrode EP and the electrode EG. A relative positional relationship between a metallic conductive wire and a dielectric is not limited to the example shown in FIGS. 2A and 2B. For example, one of the electrode EP and the electrode EG may be covered with a dielectric. As shown in FIGS. 2A and 2B, it is more desirable that the electrode EP and the electrode EG are both covered with a dielectric. This is because such a configuration prevents degradation of an electrode due to adhesion of mist to a metallic conductive wire. It is desirable that the electrode EP and the electrode EG are arranged in parallel so as to generate a plasma stably.

FIG. 3 is a (second) view for explaining details of the nanoparticle assembly producing apparatus 11. FIG. 3 shows the nanoparticle assembly producing apparatus 11 shown in FIG. 2A being sliced along a plane parallel to the Z-axial direction, and shows parts above the mist route 112 in the nanoparticle assembly producing apparatus 11 viewed from the −X direction.

The mist generated in the mist generation tank 121 is guided to the mist route 112 and reaches the electrode 111A and the electrode 111B. The mist is excited by the plasma generated between the electrodes, leading to formation of an assembly. Although the nanoparticle assembly producing apparatus 11 shown in FIGS. 1 to 3 is configured to eject the nanoparticle assembly in a direction opposite to gravity, the ejection direction of the nanoparticle assembly is not limited thereto. The nanoparticle assembly formed herein may be ejected in the direction of gravity.

The nanoparticle assembly producing apparatus 11 requires a shorter forming time than a wet-type method in the related art for forming an assembly. In other words, the nanoparticle assembly producing apparatus 11 efficiently forms a highly versatile nanoparticle assembly.

Figure 4:
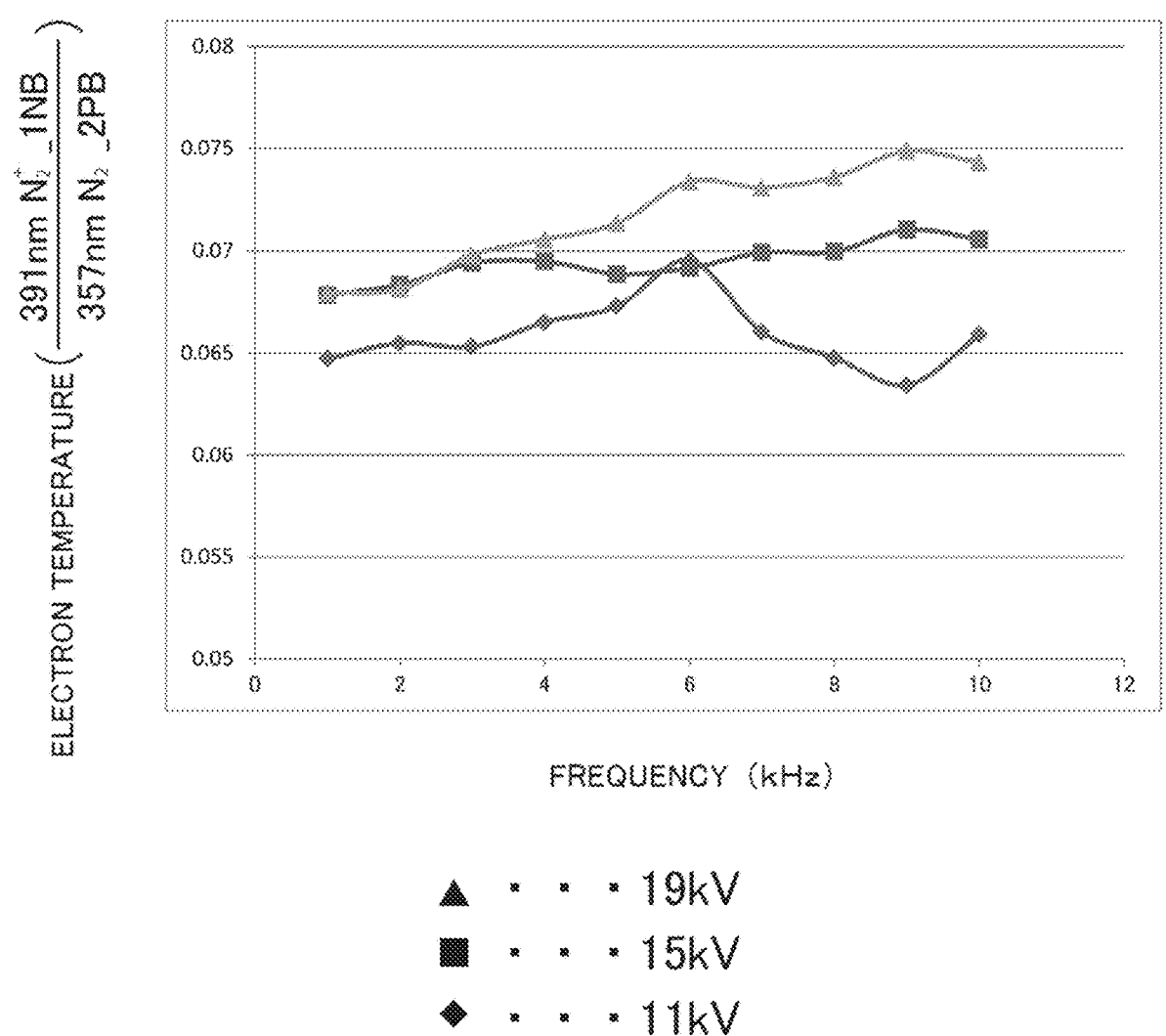
FIG. 4 is a graph showing a relationship between plasma states, frequencies, and applied voltages.

FIG. 4 is a graph showing a relationship between plasma states, frequencies, and applied voltages. Frequencies and applied voltages shown in this figure are frequencies and voltages to be applied between the electrode 111A and the electrode 111B.

An emission spectrum of $N_2$ is obtained in an atmospheric-pressure plasma. In the emission spectrum, there are emission attributed to a first negative band of $N_2^+$ at a wavelength of 391 nm and emission attributed to a second positive band of $N_2$* at a wavelength of 357 nm. It is known that a ratio of an emission intensity attributed to the first negative band and an emission intensity attributed to the second positive band is correlated with an electron temperature of a plasma. Using this ratio enables quantification of plasma states. In this embodiment, an emission intensity of an atmospheric-pressure plasma at a wavelength of 391 nm ($I_{391}$) and an emission intensity at a wavelength of 357 nm ($I_{357}$) are measured by fiber spectroscopy. Values representing a ratio ($I_{391}/I_{357}$) of these emission intensities are taken along the ordinate of FIG. 4.

FIG. 4 shows that $I_{391}/I_{357}$ rapidly increases at an applied voltage of 19 kV and a frequency of 6 kHz or more. Application of a voltage at a high frequency makes it possible to observe an area where a specific plasma is formed. To form a preferable nanoparticle assembly, it is desirable that $I_{391}/I_{357}$ is 0.072 or more and less than 0.08.

Using a power source having a pulse width of 500 ns and a voltage rise time of 200 ns or less, a more stable plasma is generated. In regard to a power source, it is desirable to use one that stably maintains discharge and applies a high voltage. Specifically, it is desirable that a voltage to be applied to the electrodes is 16 kV or more and less than 20 kV. Furthermore, a frequency of the voltage to be applied to the electrodes is desirably 6 kHz or more and less than 11 kHz.

<First Modification of Nanoparticle Assembly Producing Apparatus>

Figure 5:
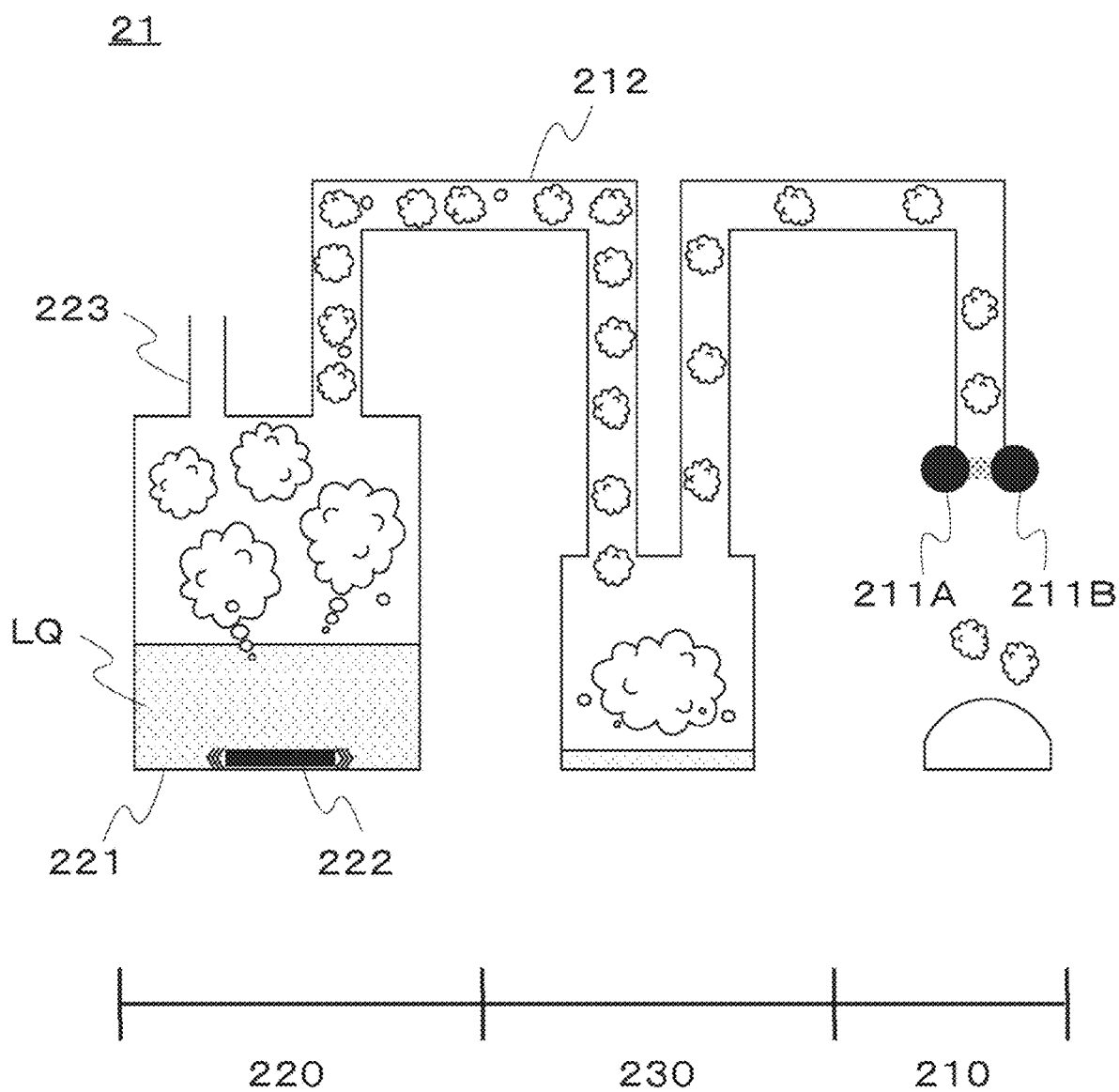
FIG. 5 is a view showing a modification of the nanoparticle assembly producing apparatus.
Figure 6:
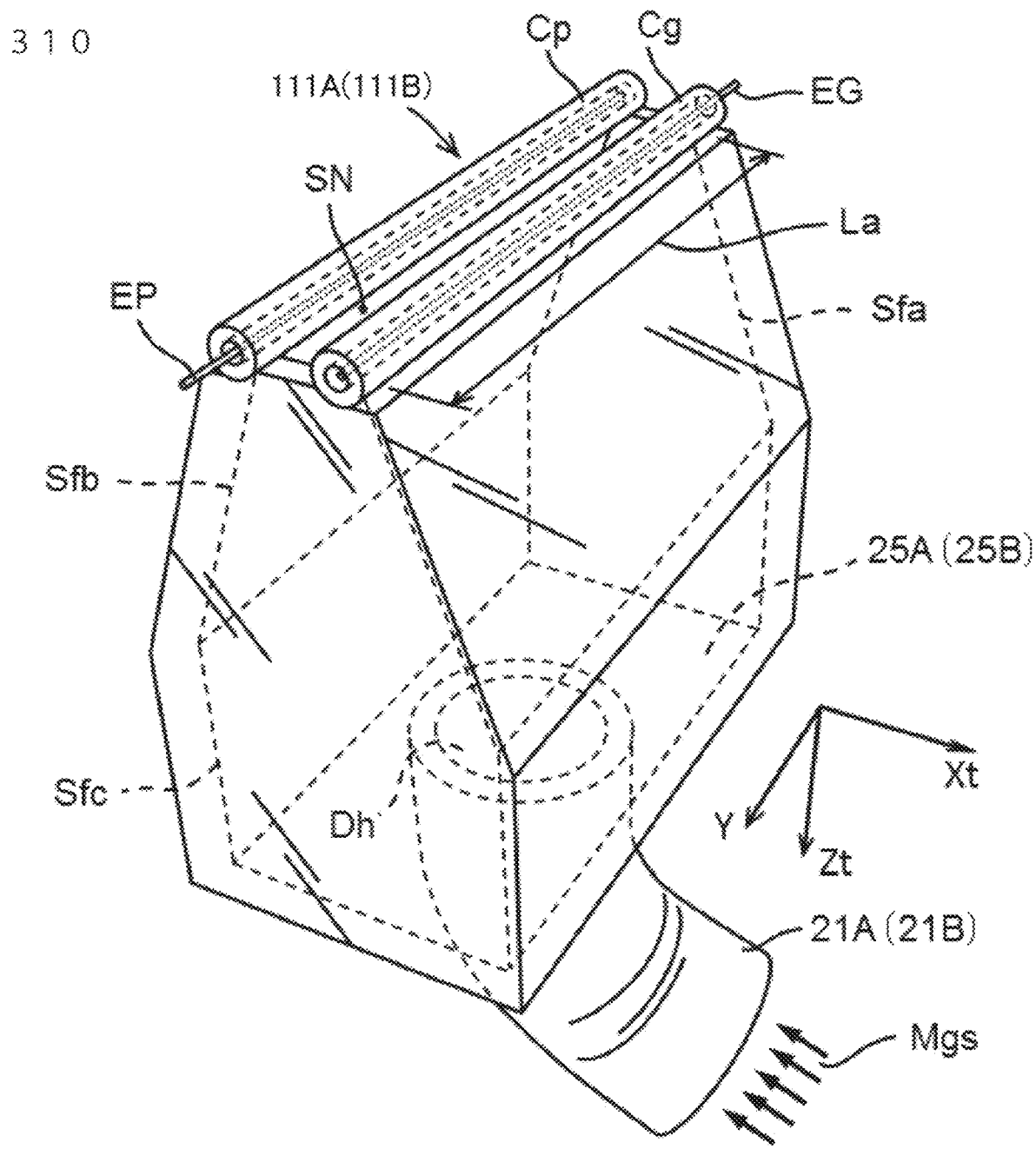
FIG. 6 is a view showing a modification of the nanoparticle assembly producing apparatus.

FIG. 5 is a view showing a nanoparticle assembly producing apparatus 21 which is a first modification of the nanoparticle assembly producing apparatus. Hereinafter described is differences from the nanoparticle assembly producing apparatus 11 of FIG. 1. The nanoparticle assembly producing apparatus 21 includes a plasma generation unit 210, a mist generation unit 220, and a mist trap 230.

The plasma generation unit 210 includes an electrode 211A and an electrode 211B. The mist generation unit 220 includes a mist generation tank 221, an ultrasonic transducer 222, and a gas inlet pipe 223. The electrode 211A, the electrode 211B, the mist generation tank 221, the ultrasonic transducer 222, and the gas inlet pipe 223 are similar to the electrode 111A, the electrode 111B, the mist generation tank 121, the ultrasonic transducer 122, and the gas inlet pipe 123 in the above-mentioned embodiment.

The mist generation unit 220 and the mist trap 230 are connected by a mist route 212, and mist generated in the mist generation unit 220 is transmitted to the mist trap 230. In the mist trap 230, unnecessary mist is liquefied and accumulated. The mist trap 230 and the plasma generation unit 210 are connected by the mist route 212, and mist that is not liquefied is guided to the plasma generation unit 210.

Vaporization of moisture in nanoparticles that have passed between the electrodes in the plasma generation unit 210 leads to formation of a nanoparticle assembly which is a secondary particle. As shown in FIG. 5, the nanoparticle assembly producing apparatus 21 may be manufactured to accumulate the nanoparticle assembly on an object. Similarly to the first embodiment, in this modification, a direction in which the nanoparticle assembly is ejected is not limited to a direction shown in FIG. 5.

<Second Modification of Nanoparticle Assembly Producing Apparatus>

FIG. 6 is a view showing a plasma generation unit 310 of a nanoparticle assembly producing apparatus 31 which is a second modification of the nanoparticle assembly producing apparatus. The plasma generation unit 310 is made of a quartz plate, including inclined inner walls Sfa and Sfb having a constant length in the Y direction and a width in the Xt direction gradually narrowing toward the −Zt direction, a side inner wall Sfc parallel to the Xt-Zt plane, and a top board 25A (25B) parallel to the Y-Xt plane. In the top board 25A (25B), a duct 21A (21B) from a mist generation unit is connected to an opening Dh, and mist gas Mgs is supplied to the plasma generation unit 310. A leading end of the plasma generation unit 310 in the −Zt direction is formed with a slot-shaped opening SN elongated in the Y direction and extending over a length La. A pair of electrodes 111A (111B) is provided to sandwich the opening SN in Xt direction. Therefore, the mist gas Mgs (positive pressure) supplied to the plasma generation unit 310 through the opening Dh passes between the pair of electrodes 111A (111B) through the slot-shaped opening SN and is ejected in the −Zt direction with a uniform flow distribution.

The pair of electrodes 111A (111B) includes a wire electrode EP extending in the Y direction beyond the length La and a wire electrode EG extending in the Y direction beyond the length La. The electrodes EP and EG are held in cylindrical quartz tubes functioning as a dielectric Cp and a dielectric Cg, respectively, and are parallel to each other at a predetermined interval in the Xt direction. The quartz tubes are fixed to the leading end of the plasma generation unit 310, being positioned on both sides of the slot-shaped opening SN. It is desirable that the quartz tubes do not contain a metal component inside. Furthermore, the dielectrics Cp and Cg may be ceramic tubes having a high dielectric strength voltage.

The present invention will be explained in more detail with reference to the following Examples and Comparative Examples, but the present invention is not limited to the following Examples.

Example 1

A nanoparticle assembly was produced with the nanoparticle assembly producing apparatus 21 described with reference to FIG. 5. An aqueous dispersion (NanoTek Slurry: available from CI Kasei Co., Ltd.) containing ITO (tin-doped indium oxide) particulates was prepared as the precursor LQ. The ITO particulates in the dispersion has a particle size of 10 to 50 nm and an average primary particle size of 30 nm. The ITO particulates in the dispersion has a concentration of 15 wt. %.

A voltage was applied to the ultrasonic transducer 222 (manufactured by Honda Electronics Co., Ltd.), and the ultrasonic transducer 222 was vibrated at 2.4 MHz to generate mist from the precursor LQ. The mist generated herein was transmitted to the plasma generation unit 210, using Ar gas.

Ti wires were used for the electrode EP and the electrode EG which were covered with the dielectric Cp and the dielectric Cg including $SiO_2$. An interval between the dielectric Cp and the dielectric Cg was 2 mm. In the plasma generation unit 210, a voltage in 19 kV was applied between the electrodes, and an atmospheric-pressure plasma was generated at a frequency of 10 kHz.

Figure 7:
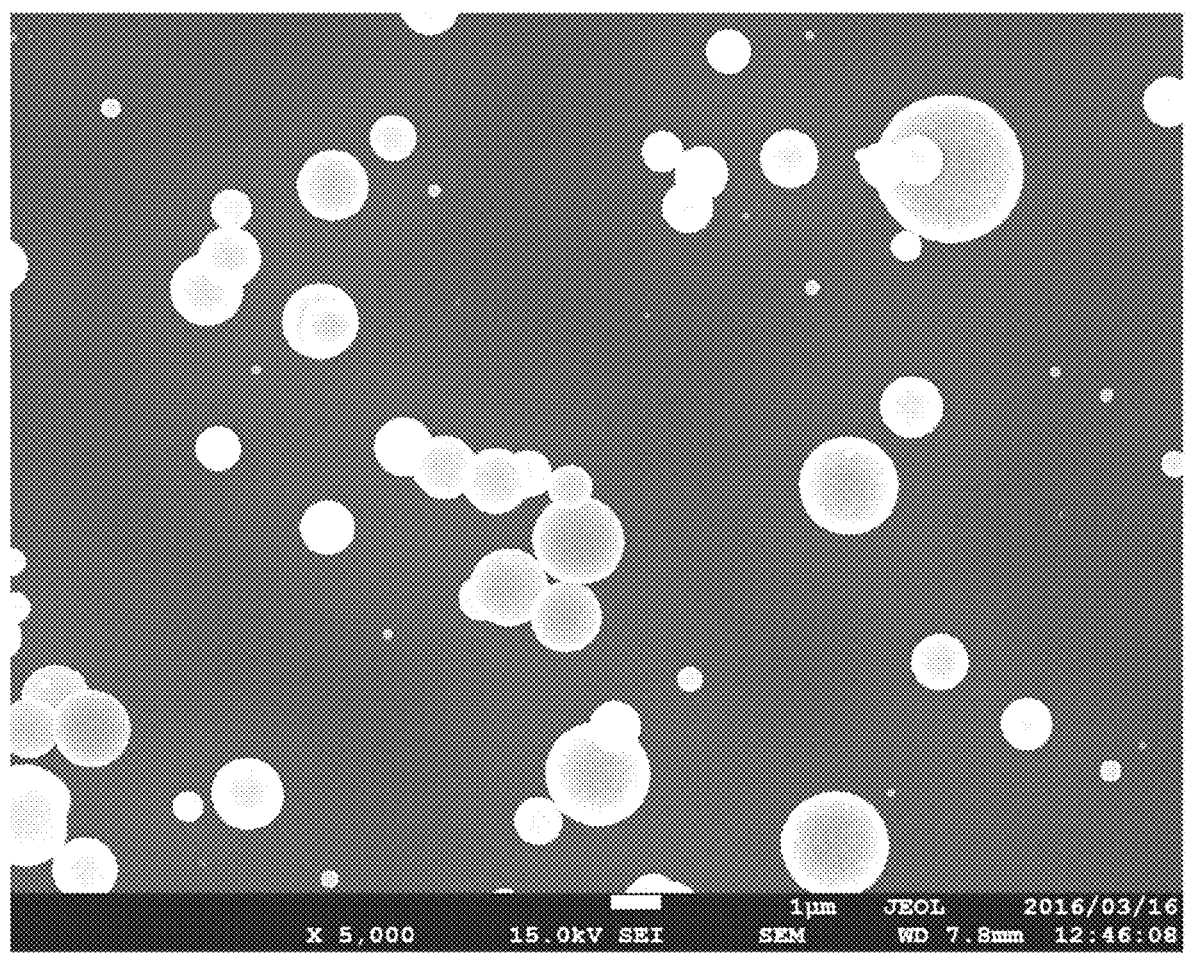
FIG. 7 is an FE-SEM image (5,000-fold) of a nanoparticle assembly according to Example 1 (19 kV-10 kHz)

FIG. 7 is an FE-SEM image (5,000-fold) of the nanoparticle assembly according to Example 1 (19 kV-10 kHz). This image shows the nanoparticle assembly observed by FE-SEM at 5,000-fold magnification (lateral direction: 25 μm, longitudinal direction: 15 μm). A plurality of substantially spherical nanoparticle assemblies was observed in a field of view.

Figure 8:
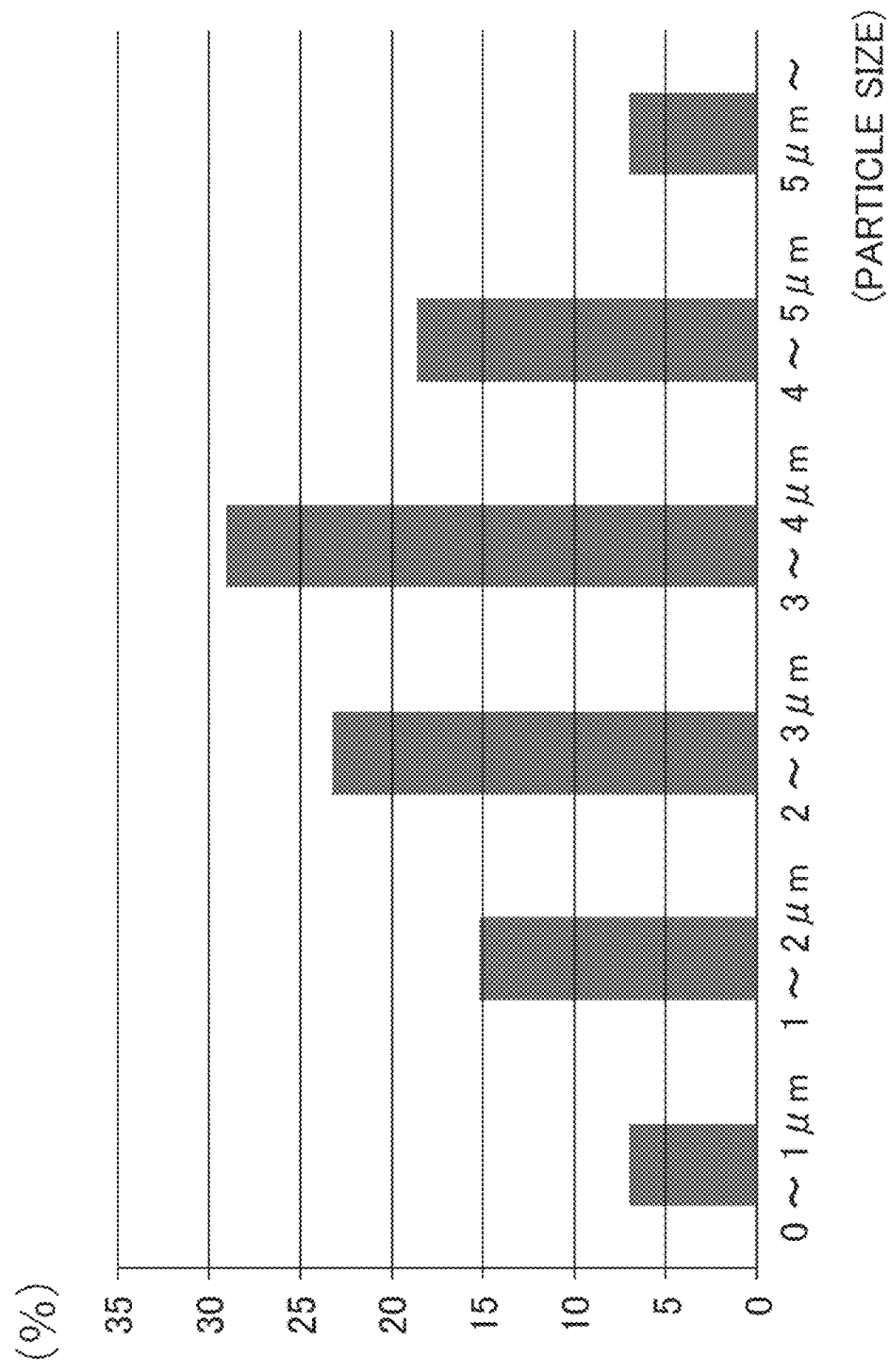
FIG. 8 is a particle size distribution according to Example 1 (19 kV-10 kHz)

FIG. 8 shows a particle size distribution (diameter distribution) of the nanoparticle assemblies according to Example 1 (19 kV-10 kHz). Sixteen fields of view of the 5,000-fold image observed by FE-SEM were acquired. FIG. 8 shows the particle size distribution calculated by determining a particle size observed in the image. The particle size distributions in the following Examples and Comparative Examples were also obtained by a similar method. This figure indicates that nanoparticle assemblies having a particle size of 3 μm to 4 μm were produced most frequently.

Figure 9:
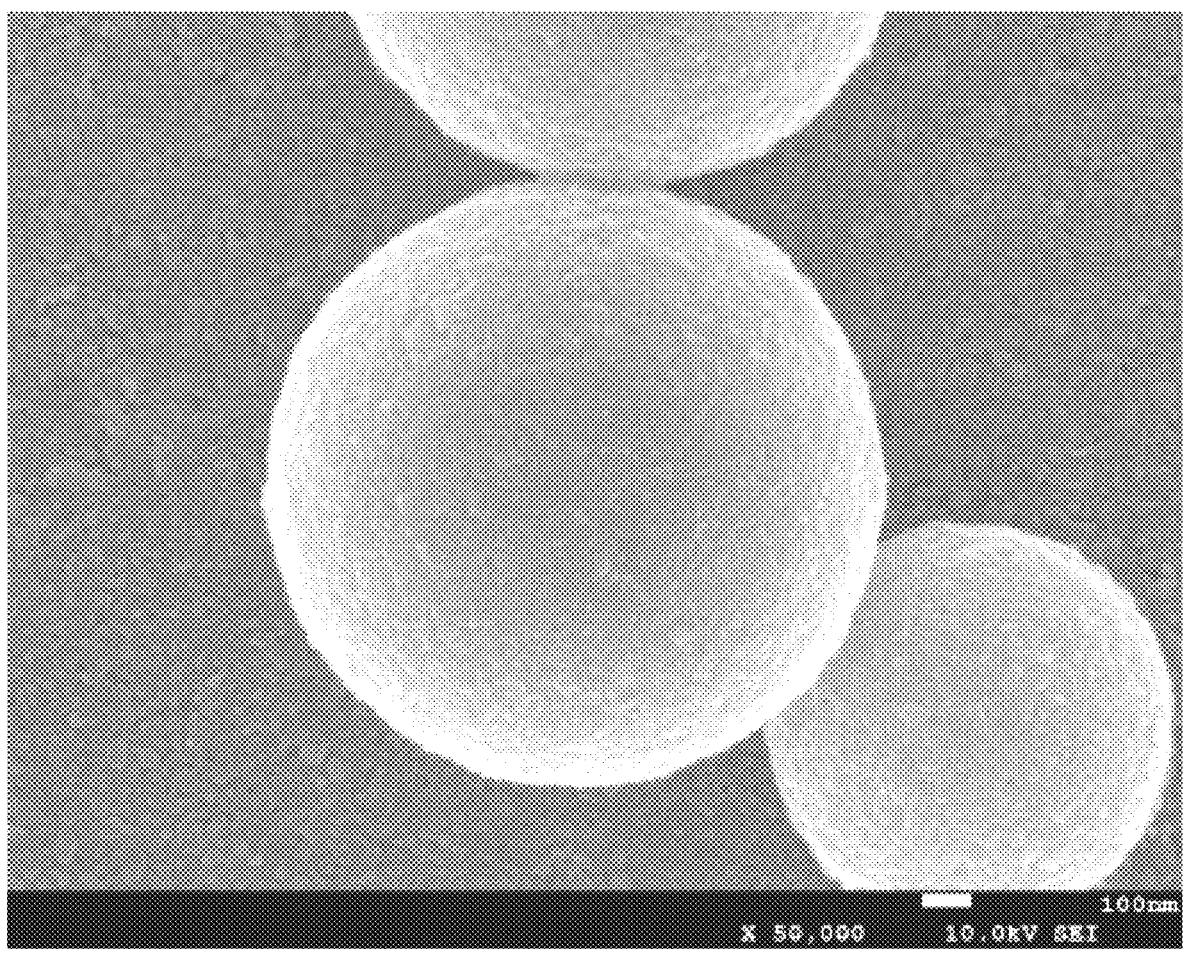
FIG. 9 is an FE-SEM image (50,000-fold) of the nanoparticle assembly according to Example 1 (19 kV-10 kHz)

FIG. 9 is an FE-SEM image (50,000-fold) of the nanoparticle assembly according to Example 1 (19 kV-10 kHz). A substantially spherical nanoparticle assembly was observed.

Example 2

Using the nanoparticle assembly producing apparatus 21 described with reference to FIG. 5, a voltage in 19 kV was applied between the electrodes, and an atmospheric-pressure plasma was generated at a frequency of 8 kHz. Other production conditions are similar to those in Example 1.

Figure 10:
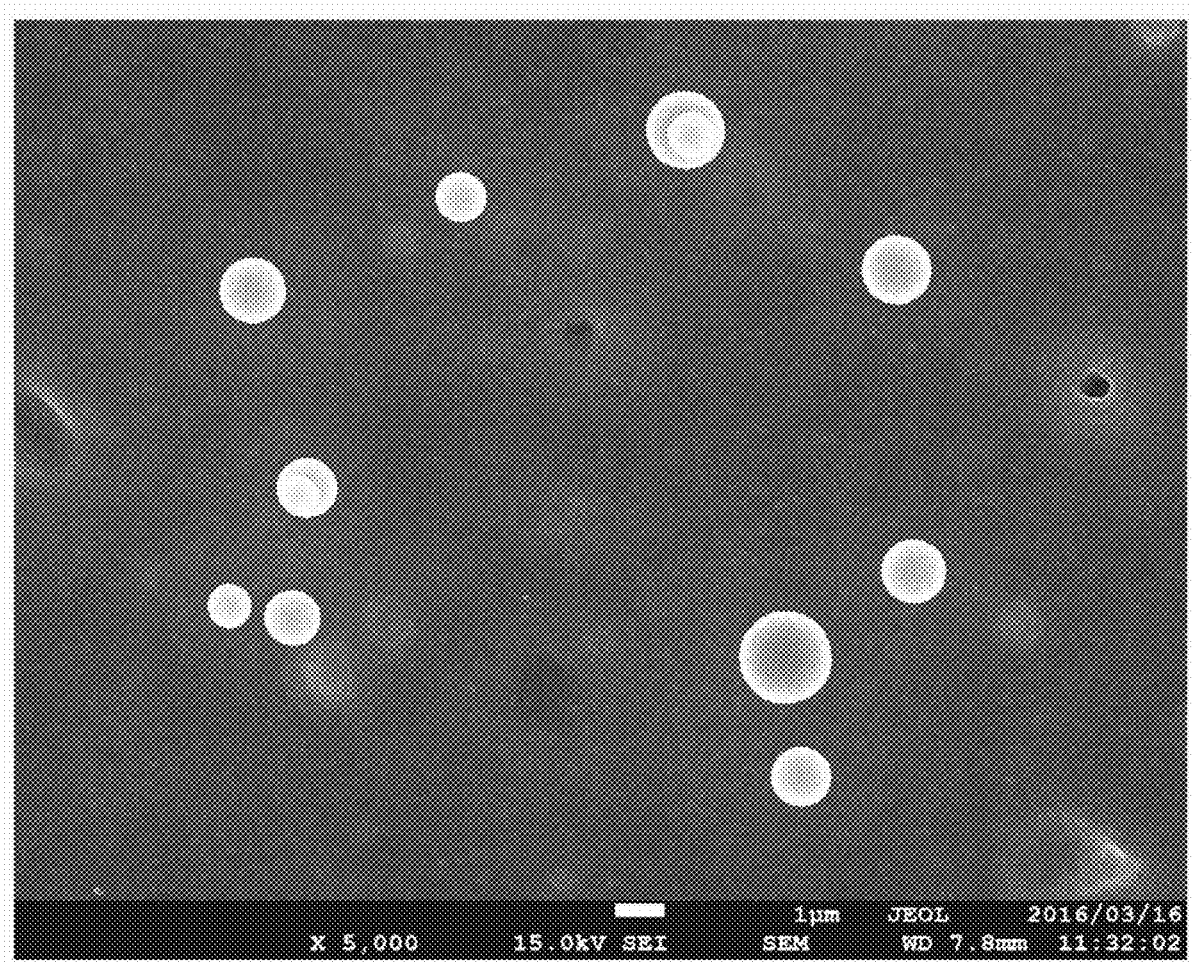
FIG. 10 is an FE-SEM image (5,000-fold) of a nanoparticle assembly according to Example 2 (19 kV-8 kHz)

FIG. 10 is an FE-SEM image (5,000-fold) of a nanoparticle assembly according to Example 2 (19 kV-8 kHz). Although the number of nanoparticle assemblies was smaller than that in Example 1, a plurality of substantially spherical nanoparticle assemblies was observed.

Figure 11:
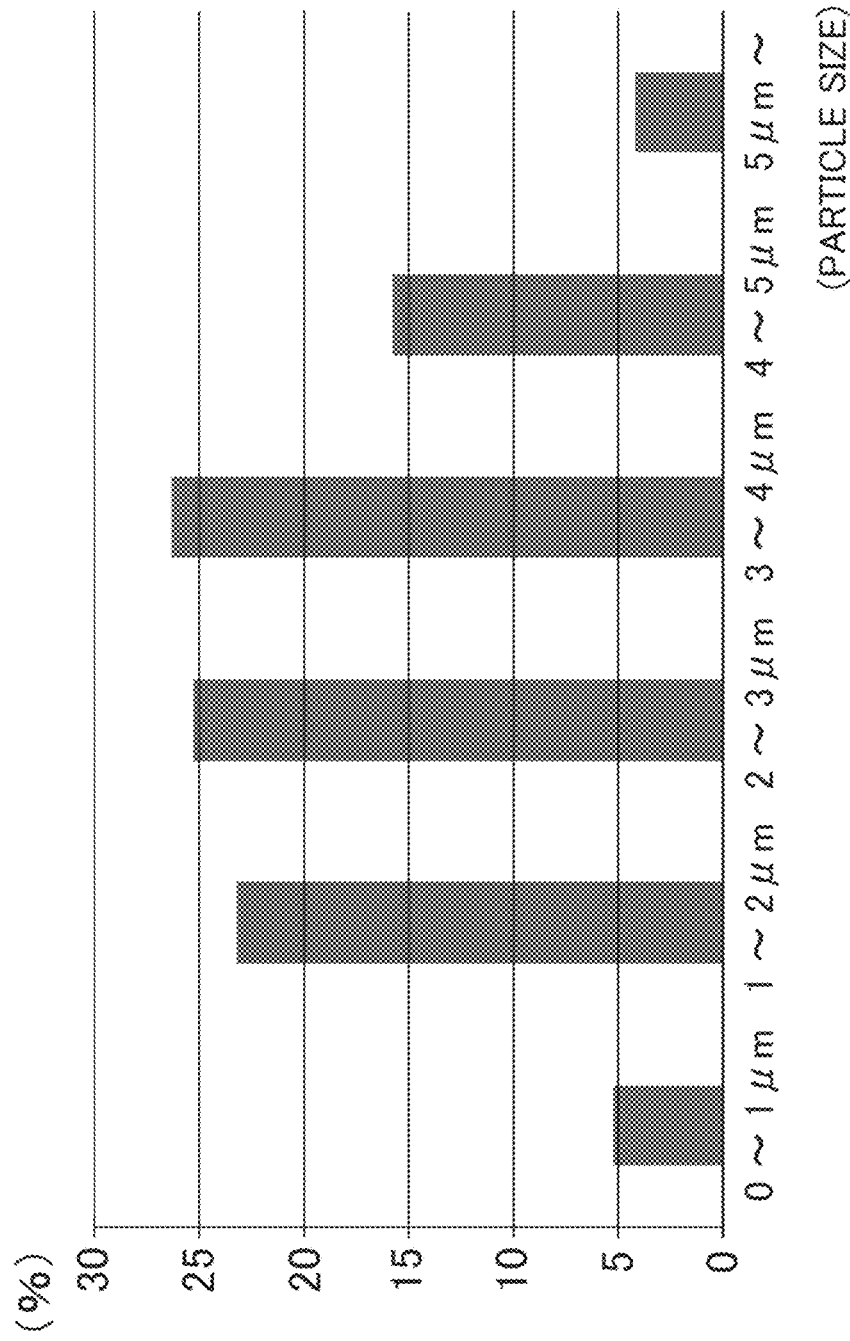
FIG. 11 is a particle size distribution according to Example 2 (19 kV-8 kHz)

FIG. 11 shows a particle size distribution (diameter distribution) of the nanoparticle assemblies according to Example 2 (19 kV-8 kHz). Compared to the particle size distribution in Example 1, a proportion of nanoparticle assemblies having a particle size of 1 to 2 μm and 2 μm to 3 μm increased in Example 2.

Figure 12A:
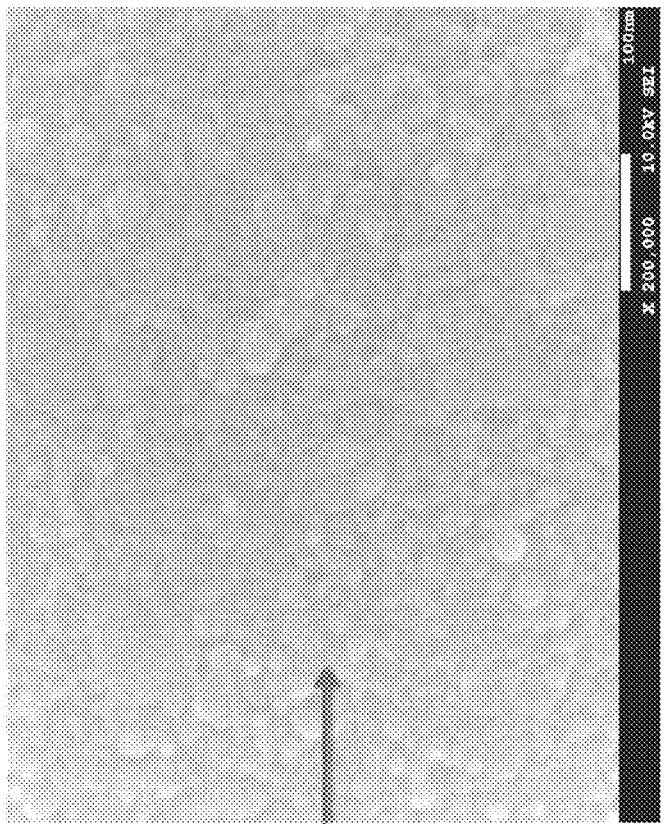
FIGS. 12A to 12C are FE-SEM images of the nanoparticle assembly according to Example 2 (19 kV-8 kHz)
Figure 12B:
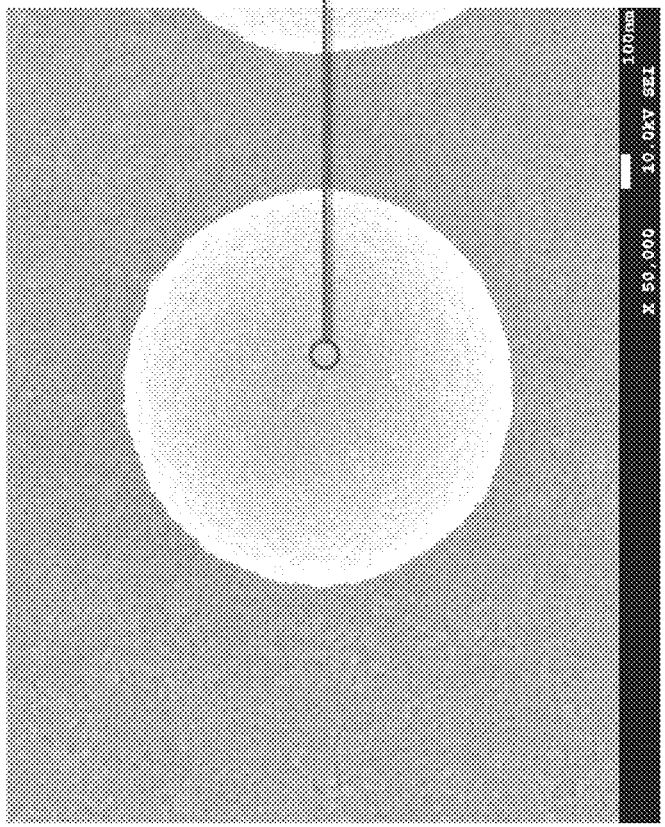
Figure 12C:
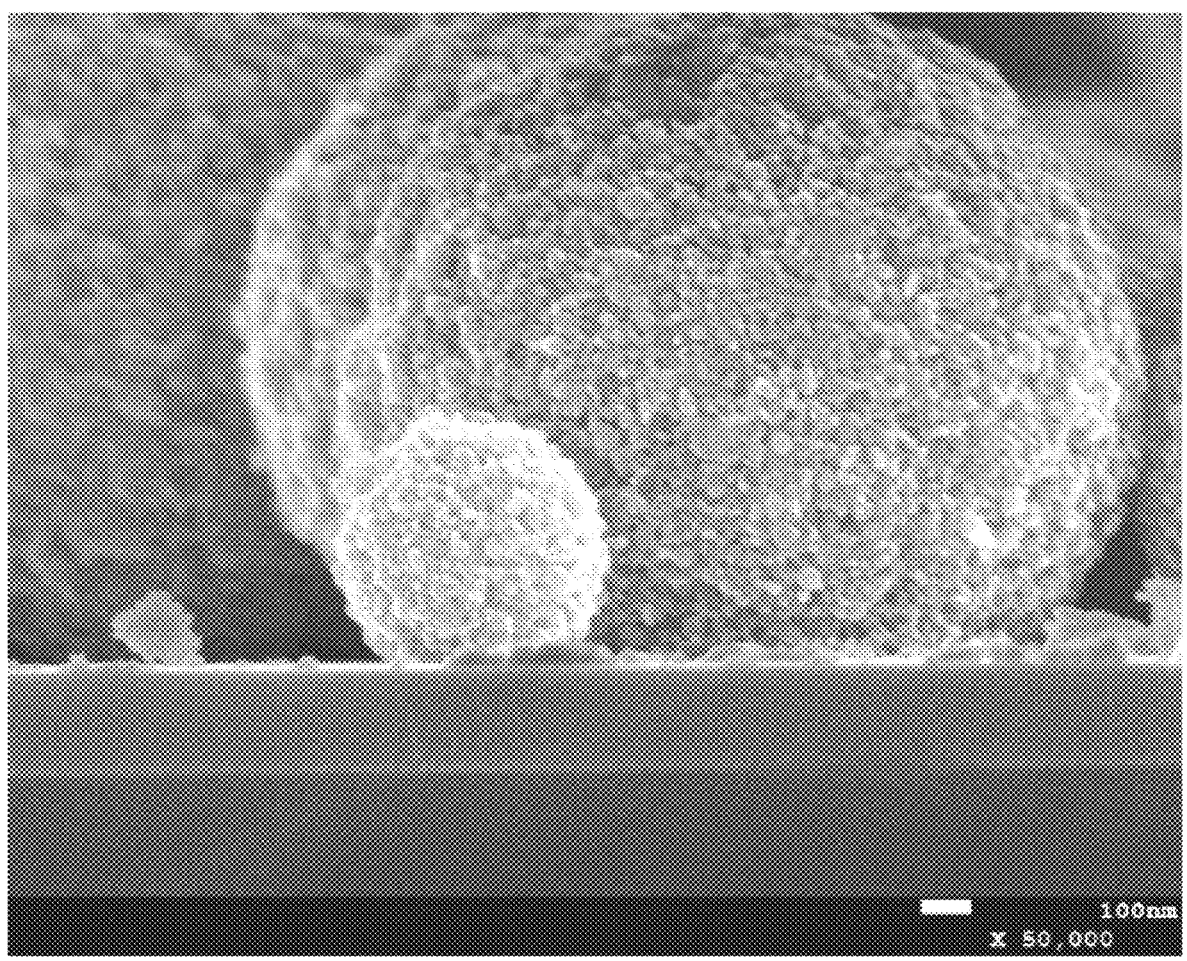

FIGS. 12A to 12C are FE-SEM images of the nanoparticle assembly according to Example 2 (19 kV-8 kHz). FIG. 12A shows a 50,000-fold top view, FIG. 12B shows a 200,000-fold top view, and FIG. 12C shows a 50,000-fold side view of the nanoparticle assembly. FIG. 12B is an image obtained by increasing the magnification of a part of the nanoparticle assembly shown in FIG. 12A.

FIG. 12A shows that a substantially spherical nanoparticle assembly is obtained even when a voltage is applied at a frequency of 8 kHz. FIG. 12B and FIG. 12C show that assemblies were formed while the surface shape of the nanoparticles remained. Therefore, a nanoparticle assembly having a large specific surface area was produced.

Example 3

Using the nanoparticle assembly producing apparatus 21 described with reference to FIG. 5, a voltage in 19 kV was applied between the electrodes, and an atmospheric-pressure plasma was generated at a frequency of 6 kHz. Other production conditions are similar to those in Example 1.

Figure 13:
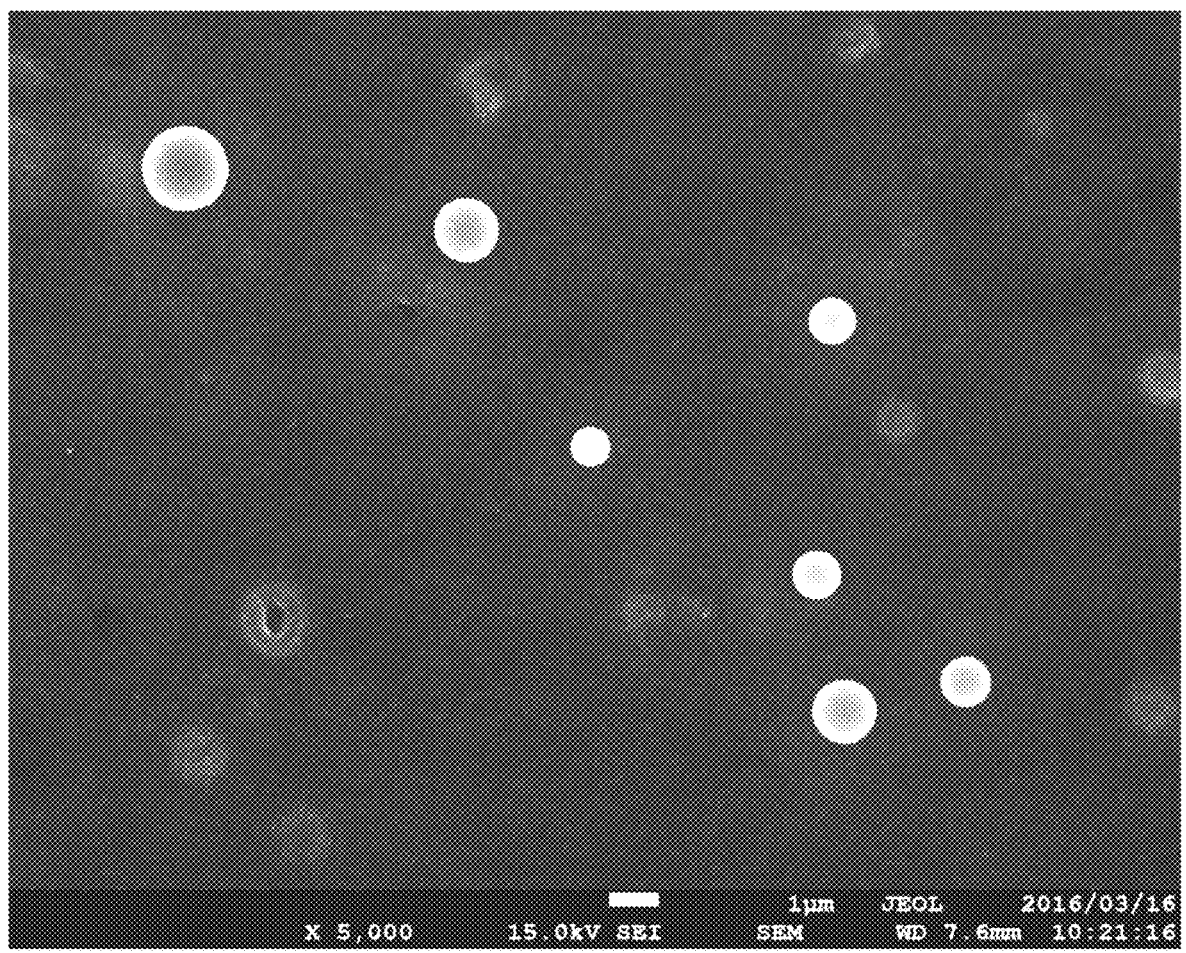
FIG. 13 is an FE-SEM image (5,000-fold) of a nanoparticle assembly according to Example 3 (19 kV-6 kHz)

FIG. 13 is an FE-SEM image (5,000-fold) of a nanoparticle assembly according to Example 3 (19 kV-6 kHz). Similarly to Example 2, a plurality of substantially spherical nanoparticle assemblies was observed.

Figure 14:
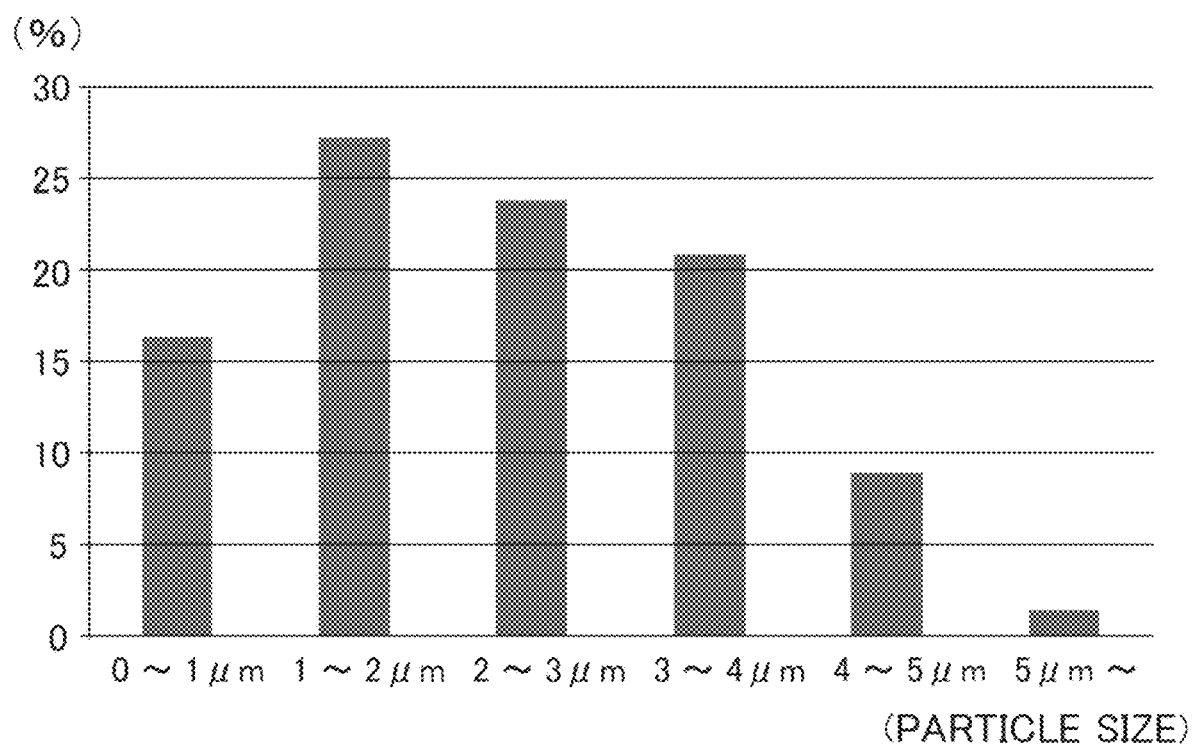
FIG. 14 is a particle size distribution according to Example 3 (19 kV-6 kHz)

FIG. 14 shows a particle size distribution (diameter distribution) of the nanoparticle assemblies according to Example 3 (19 kV-6 kHz). Compared to Example 1 and Example 2, a proportion of nanoparticle assemblies having a particle size of 0 to 1 μm and 1 μm to 2 μm increased in Example 3.

Figure 15:
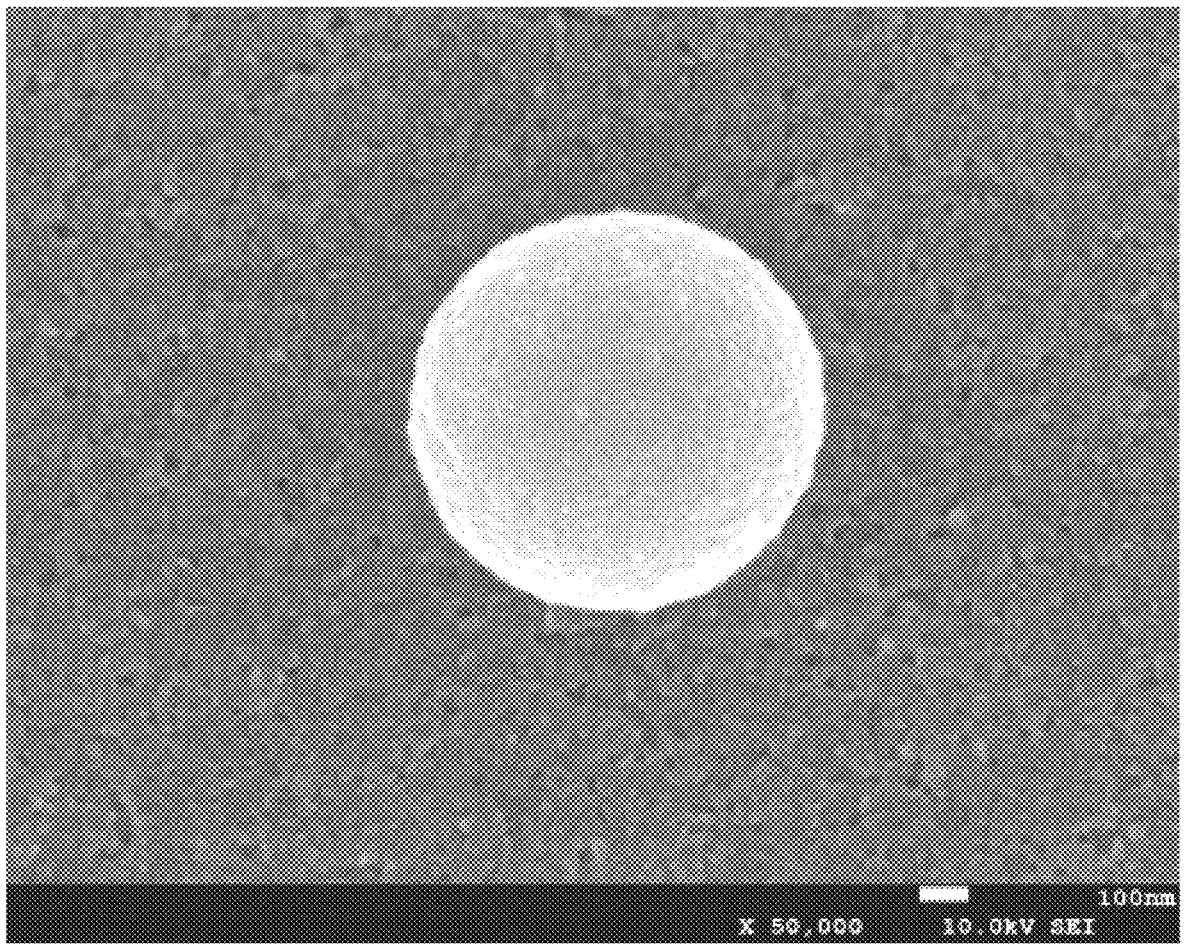
FIG. 15 is an FE-SEM image (50,000-fold) of the nanoparticle assembly according to Example 3 (19 kV-6 kHz)

FIG. 15 is an FE-SEM image (50,000-fold) of a nanoparticle assembly according to Example 3 (19 kV-6 kHz). FIG. 15 shows that a substantially spherical nanoparticle assembly was obtained.

Comparative Example 1

Using the nanoparticle assembly producing apparatus 21 described with reference to FIG. 5, a voltage in 19 kV was applied between the electrodes, and an atmospheric-pressure plasma was generated at a frequency of 4 kHz. Other production conditions are similar to those in Example 1.

The result showed that an ITO film was formed on the substrate, and a nanoparticle assembly was not observed. In regard to the production conditions of Comparative Example 1, as shown in FIG. 4, the electron temperature ($I_{391}/I_{357}$) was under 0.072.

Comparative Example 2

Using the nanoparticle assembly producing apparatus 21 described with reference to FIG. 5, a voltage in 19 kV was applied between the electrodes, and an atmospheric-pressure plasma was generated at a frequency of 2 kHz. Other production conditions are similar to those in Example 1.

The result showed that an ITO film was formed on the substrate, and a nanoparticle assembly was not observed. In regard to the production conditions of Comparative Example 2, as shown in FIG. 4, $I_{391}/I_{357}$ was under 0.072.

Comparative Example 3

Using the nanoparticle assembly producing apparatus 21 described with reference to FIG. 5, a voltage in 15 kV was applied between the electrodes, and an atmospheric-pressure plasma was generated at a frequency of 10 kHz. Other production conditions are similar to those in Example 1.

The result showed that an ITO film was formed on the substrate, and a nanoparticle assembly was not observed. In regard to the production conditions of Comparative Example 3, as shown in FIG. 4, $I_{391}/I_{357}$ was under 0.072.

Comparative Example 4

Using the nanoparticle assembly producing apparatus 21 described with reference to FIG. 5, a voltage in 15 kV was applied between the electrodes, and an atmospheric-pressure plasma was generated with a change of frequencies, at 8 kHz, 6 kHz, 4 kHz, and 2 kHz. Other production conditions are similar to those in Example 1.

The result showed that no matter which frequencies of 8 kHz, 6 kHz, 4 kHz or 2 kHz was used when the voltage was applied between the electrodes, an ITO film was formed on the substrate, and a nanoparticle assembly was not observed.

Consideration on Examples 1 to 3 and Comparative Example

Considering the above Examples 1 to 3 and Comparative Example, it is desirable that a voltage to be applied to the plasma generation unit 210 is 16 kV or more and less than 20 kV. Applying an appropriate voltage yields a preferable nanoparticle assembly. The results of Examples 1 to 3 show that an average diameter of the nanoparticle assemblies tends to increase with an increase in frequency of a voltage applied to the electrodes.

Example 4

A nanoparticle assembly was produced using the nanoparticle assembly producing apparatus 21 described with reference to FIG. 5. An aqueous dispersion (NanoTek Slurry: available from CI Kasei Co., Ltd.) containing GZO (gallium-doped zinc oxide) particulates was prepared as the precursor LQ. The GZO particulates in the dispersion has a particle size of 10 to 50 nm and an average particle size of 30 nm. The GZO particulates in the dispersion has a concentration of 15 wt. %.

In the plasma generation unit 210, a voltage in 19 kV was applied between the electrodes, and an atmospheric-pressure plasma was generated at a frequency of 10 kHz. Other production conditions are similar to those in Example 1.

Figure 16A:
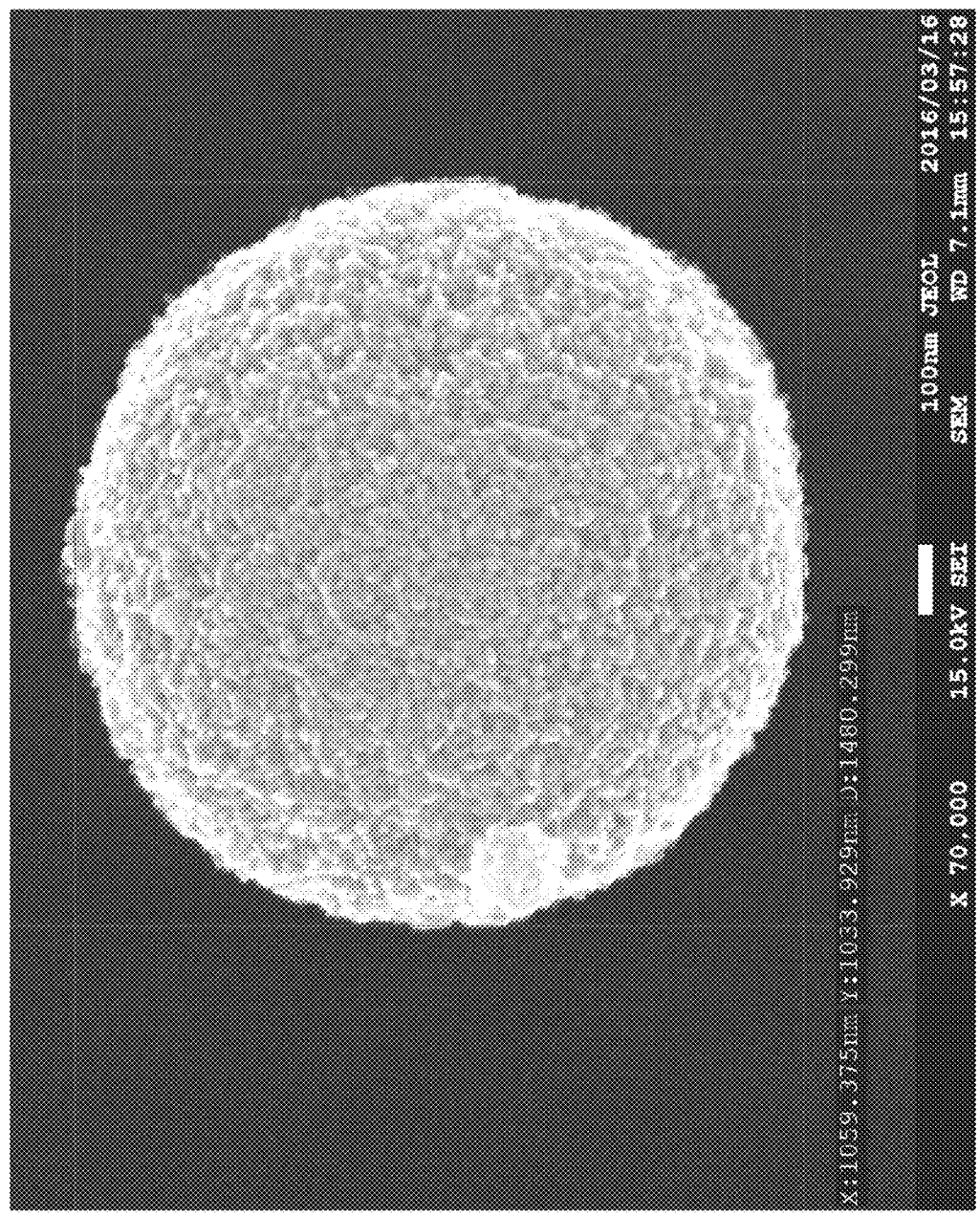

FIGS. 16A to 16F are FE-SEM images of a nanoparticle assembly according to Example 4 (19 kV-10 kHz). The magnification is appropriately changed depending on the size of the nanoparticle assembly. FIG. 16A is a view (approximately 70,000-fold) of a substantially spherical nanoparticle assembly corresponding to a particle size of 1 µm. FIG. 16B is a view (approximately 40,000-fold) of a substantially spherical nanoparticle assembly corresponding to a particle size of 2 µm. FIG. 16C is a view (approximately 27,000-fold) of a substantially spherical nanoparticle assembly corresponding to a particle size of 3 µm. FIG. 16D is a view (approximately 20,000-fold) of a substantially spherical nanoparticle assembly corresponding to a particle size of 4 µm. FIG. 16E is a view (approximately 18,000-fold) of a substantially spherical nanoparticle assembly corresponding to a particle size of 5 µm. FIG. 16F is a view (approximately 15,000-fold) of a substantially spherical nanoparticle assembly corresponding to a particle size of 5.5 µm.

Figure 17:
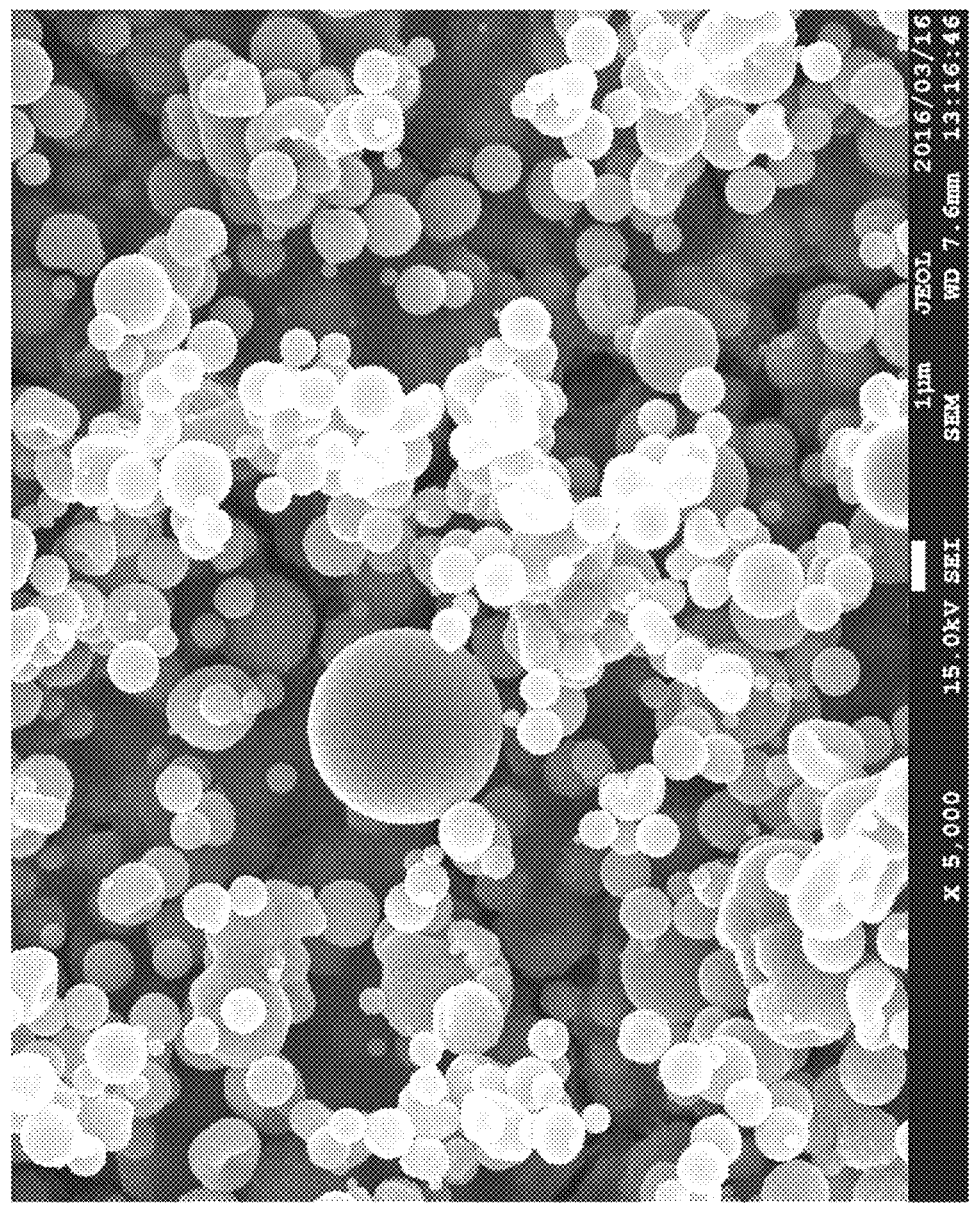
FIG. 17 is an FE-SEM image (5,000-fold) of the nanoparticle assembly according to Example 4 (19 kV-10 kHz)

FIG. 17 is an FE-SEM image (5,000-fold) of a nanoparticle assembly according to Example 4 (19 kV-10 kHz). Many of substantially spherical nanoparticle assemblies was observed.

Figure 18:
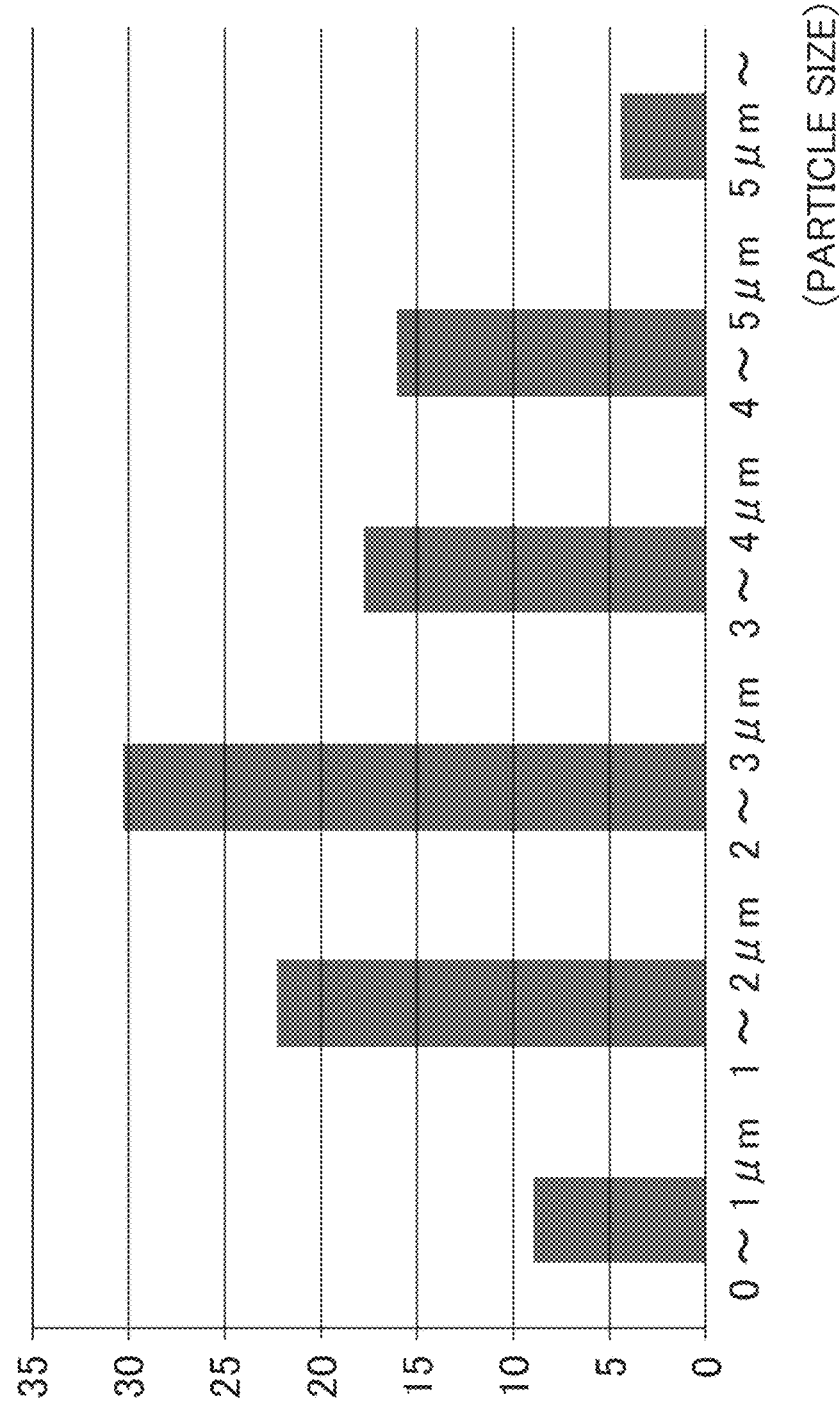
FIG. 18 is a particle size distribution according to Example 4 (19 kV-10 kHz)

FIG. 18 is a particle size distribution according to Example 4 (19 kV-10 kHz); Many of nanoparticle assemblies having a particle size 2 to 3 µm was observed.

In Example 4, substantially spherical nanoparticle assemblies having different sizes was obtained. Examples 1 and 4 show that it is also possible to yield a preferable assembly from nanoparticles other than ITO.

Example 5

An aqueous dispersion containing GZO particulates was prepared. Using the nanoparticle assembly producing apparatus 21 described with reference to FIG. 5, a voltage in 19 kV was applied between the electrodes, and an atmospheric-pressure plasma was generated at a frequency of 8 kHz. Other production conditions are similar to those in Example 4.

Figure 19:
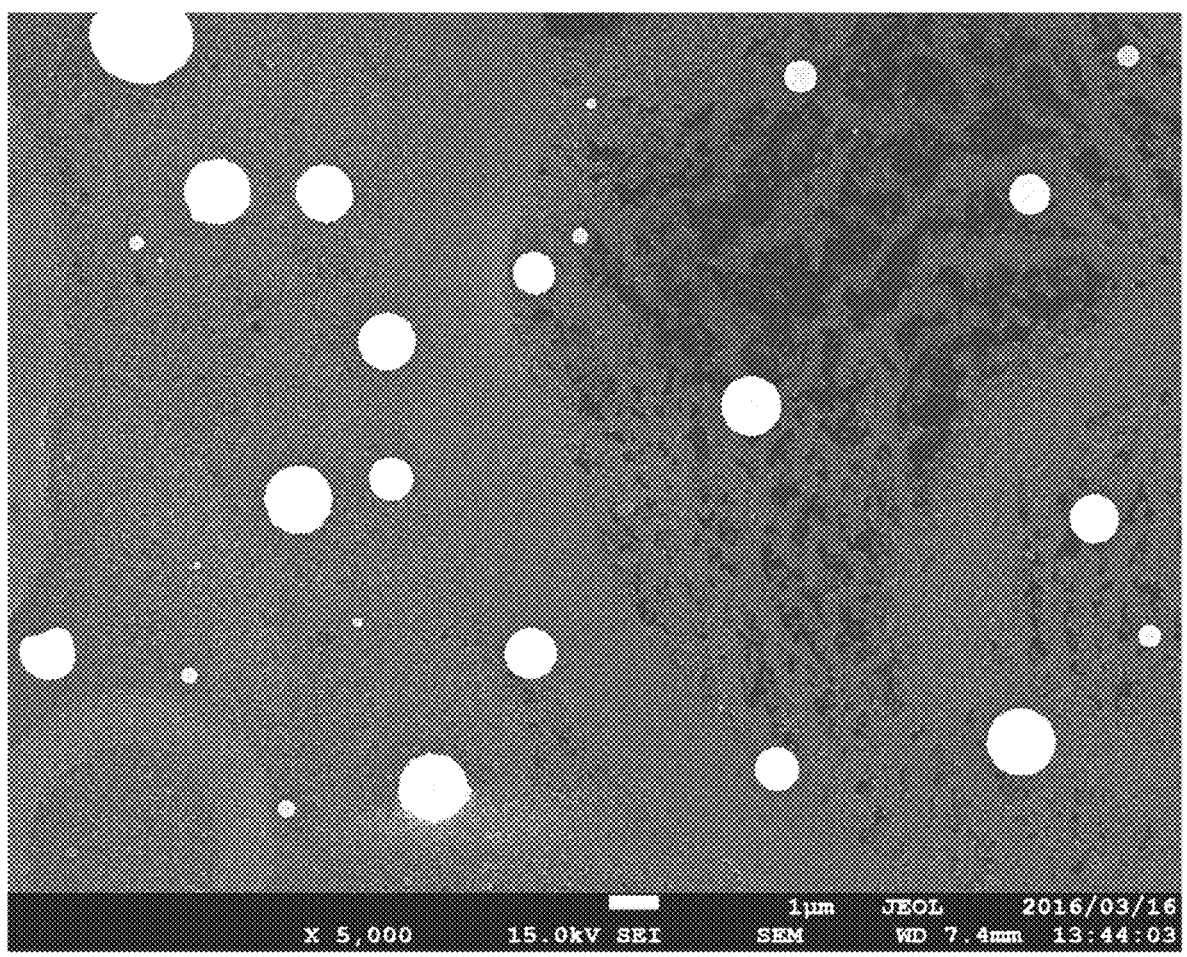
FIG. 19 is an FE-SEM image (5,000-fold) of a nanoparticle assembly according to Example 5 (19 kV-8 kHz)

FIG. 19 is an FE-SEM image (5,000-fold) of a nanoparticle assembly according to Example 5 (19 kV-8 kHz). Although the number of nanoparticle assemblies was smaller than that in Example 4, a plurality of substantially spherical nanoparticle assemblies was observed.

Figure 20:
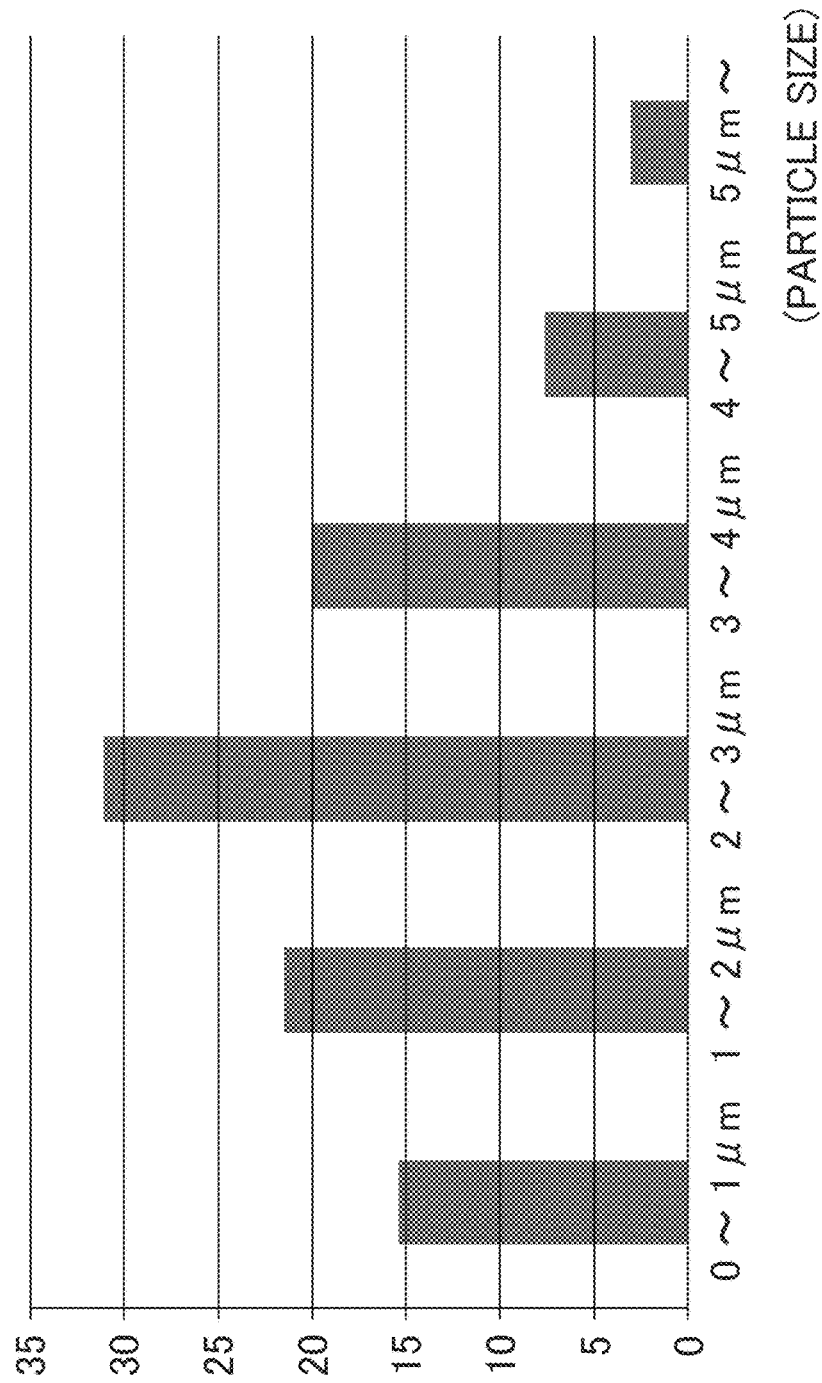
FIG. 20 is a particle size distribution according to Example 5 (19 kV-8 kHz)

FIG. 20 is a particle size distribution according to Example 5 (19 kV-8 kHz); Compared to Example 4, a proportion of nanoparticle assemblies having a particle size of 3 to 4 µm increased and those having a particle size of 4 to 5 µm decreased in Example 5.

Example 6

An aqueous dispersion containing GZO particulates was prepared. Using the nanoparticle assembly producing apparatus 21 described with reference to FIG. 5, a voltage in 19 kV was applied between the electrodes, and an atmospheric-pressure plasma was generated at a frequency of 6 kHz. Other production conditions are similar to those in Example 4.

Figure 21:
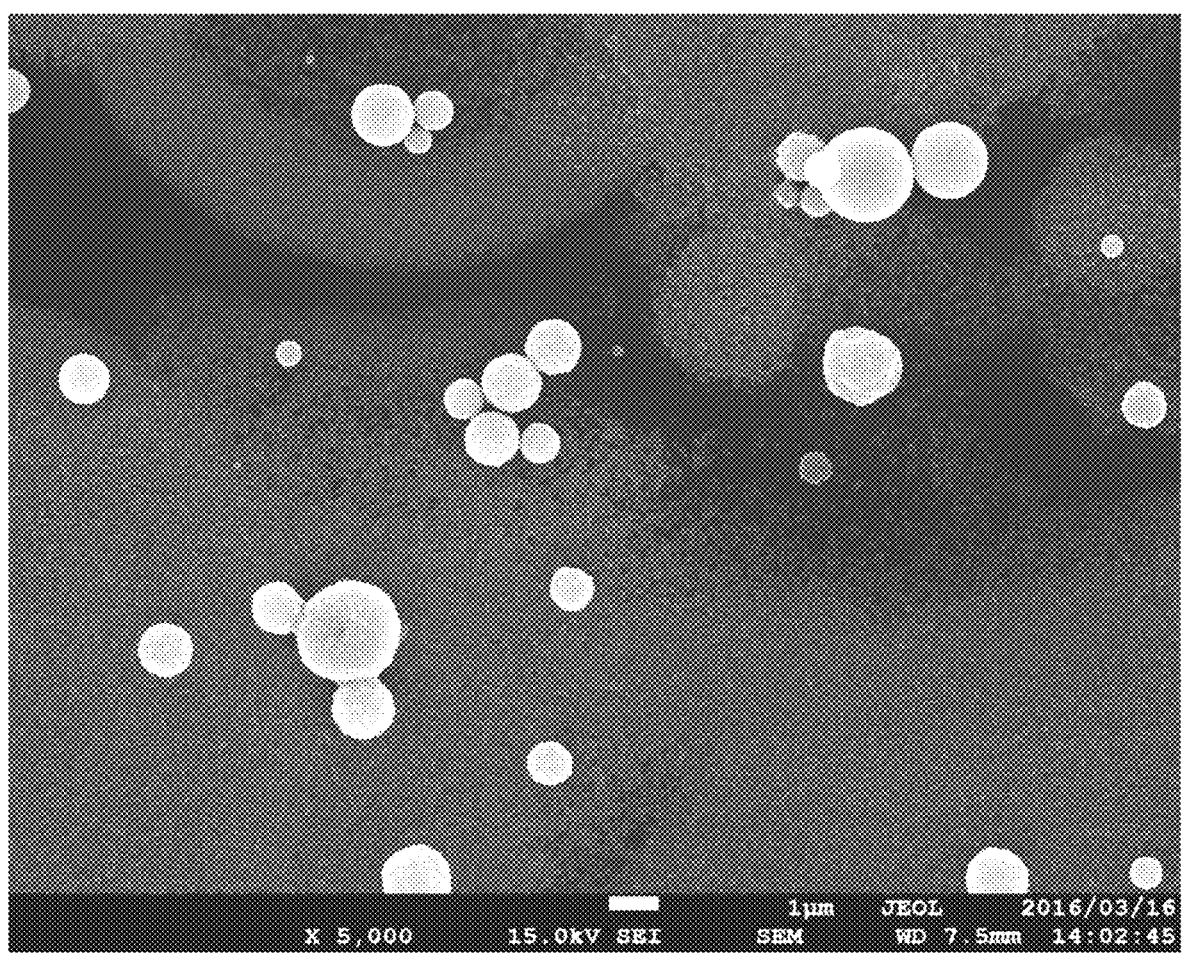
FIG. 21 is an FE-SEM image (5,000-fold) of a nanoparticle assembly according to Example 6 (19 kV-6 kHz)

FIG. 21 is an FE-SEM image (5,000-fold) of a nanoparticle assembly according to Example 6 (19 kV-6 kHz). Similarly to Example 5, a plurality of substantially spherical nanoparticle assemblies was observed.

FIG. 22 is a particle size distribution according to Example 6 (19 kV-6 kHz); Compared to Example 4 and Example 5, a proportion of nanoparticle assemblies having a particle size of 0 to 1 µm and 1 to 2 µm increased and those having a particle size of 3 to 4 µm decreased in Example 6.

The results of Examples 4 to 6 show that, even when GZO particles are used for nanoparticles, an average diameter of the nanoparticle assemblies tends to increase with an increase in frequency of a voltage applied to the electrodes, as in the case where ITO particulates are used for nanoparticles.

What is claimed is:

1. A method comprising:
   mist generation in which mist including a particle is generated from a liquid containing the particle;
   plasma generation in which a plasma is generated between a first electrode and a second electrode; and
   particle assembly production in which the mist is supplied between the first electrode and the second electrode to generate a particle assembly,
   wherein, in the plasma generation, the plasma has a ratio of emission intensities ($I_{391}/I_{357}$) of 0.072 or more and less than 0.08, where $I_{391}$ is an emission intensity at a wavelength of 391 nm and $I_{357}$ is an emission intensity at a wavelength of 357 nm,
   the particle has an average particle size of 60 nm or less, and
   the particle assembly has a diameter of more than 500 nm to 5 µm or less.

2. The method according to claim 1, wherein
   the particle has an average primary particle size of more than 10 nm and 50 nm or less, and
   the particle assembly has a diameter of more than 800 nm to 5 µm or less.

3. The method according to claim 1, wherein
   the particle has an average particle size of more than 20 nm and 40 nm or less, and
   the particle assembly has a diameter of more than 1 µm to 5 µm or less.

4. The method according to claim 1, wherein the particle is a metal or an oxide.

5. The method according to claim 4, wherein the oxide is a tin-doped indium oxide (ITO).

6. The method according to claim 4, wherein the oxide is a gallium-doped zinc oxide (GZO).

7. The method according to claim 1, wherein, in the plasma generation, the plasma is generated by applying a voltage between the first electrode and the second electrode at a frequency of 6 kHz or more and less than 11 kHz.

8. The method according to claim 1, wherein, in the plasma generation, the plasma is generated by applying a voltage between the first electrode and the second electrode of 16 kV or more and less than 20 kV.

9. A method comprising:
mist generation in which mist including a particle is generated from a liquid containing the particle;
plasma generation in which a plasma is generated between a first electrode and a second electrode; and
particle assembly production in which the mist is passed between the first electrode and the second electrode and particle assembly is produced,
wherein, in the plasma generation, the plasma has a ratio of emission intensities ($I_{391}/I_{357}$) of 0.072 or more and less than 0.08, where $I_{391}$ is an emission intensity at a wavelength of 391 nm and $I_{357}$ is an emission intensity at a wavelength of 357 nm.

10. The method according to claim 9, wherein the liquid contains a particle, and the particle is a metal or an oxide.

11. The method according to claim 10, wherein the oxide is a tin-doped indium oxide (ITO) or a gallium-doped zinc oxide (GZO).

12. A method comprising:
mist generation in which mist including a particle is generated from a liquid containing the particle; and
plasma generation in which a plasma is generated between a first electrode and a second electrode; and
particle assembly production in which the mist is passed between the first electrode and the second electrode and particle assembly is produced,
wherein, in the plasma generation, the plasma is generated by applying a voltage between the first electrode and the second electrode of 16 kV or more and less than 20 kV at a frequency of 6 kHz or more and less than 11 kHz,
the particle has an average particle size of 60 nm or less, and
the particle assembly has a diameter of more than 500 nm to 5 μm or less.

13. The method according to claim 12, wherein the particle is a metal or an oxide.

14. The method according to claim 13, wherein the oxide is a tin-doped indium oxide (ITO) or a gallium-doped zinc oxide (GZO).

* * * * *

UNITED STATES PATENT AND TRADEMARK OFFICE
CERTIFICATE OF CORRECTION

PATENT NO. : 11,177,399 B2
APPLICATION NO. : 16/263921
DATED : November 16, 2021
INVENTOR(S) : Takao Namihira et al.

Page 1 of 1

It is certified that error appears in the above-identified patent and that said Letters Patent is hereby corrected as shown below:

In the Claims

Column 10, Line 59:
In Claim 2, after "average" delete "primary".

Signed and Sealed this
Twenty-second Day of February, 2022

Drew Hirshfeld
*Performing the Functions and Duties of the*
*Under Secretary of Commerce for Intellectual Property and*
*Director of the United States Patent and Trademark Office*